(12) United States Patent
Kuijk

(10) Patent No.: US 6,396,712 B1
(45) Date of Patent: *May 28, 2002

(54) METHOD AND APPARATUS FOR COUPLING CIRCUIT COMPONENTS

(75) Inventor: Maarten Kuijk, Berchem-Antwerpen (BE)

(73) Assignee: Rose Research, L.L.C., Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/023,006

(22) Filed: Feb. 12, 1998

(51) Int. Cl.[7] .............................................. H01L 21/60
(52) U.S. Cl. ...................... 361/767; 361/760; 361/771; 361/783; 257/777; 257/778; 438/119; 439/91
(58) Field of Search ................................ 174/250, 255, 174/256, 257, 259, 117 A; 257/746, 749, 723, 724, 777, 783, 778; 361/760, 767, 768, 769, 771, 779, 783, 803; 439/66, 84, 86, 90, 91, 591; 438/119

(56) References Cited

FOREIGN PATENT DOCUMENTS

| DE | 19608513 A1 | | 9/1997 |
|---|---|---|---|
| JP | 60-116157 | * | 6/1985 |
| JP | 9-283566 | * | 10/1997 |
| WO | WO 95/01087 | | 1/1995 |
| WO | WO 97/27646 | | 7/1997 |

OTHER PUBLICATIONS

John H. Lau, Flip Chip Technologies (1996), Chapters 1,6,8,9,10.
David B. Salzman, et al.; Manufacturability of Capacitively Coupled Multichip Modules; (May 2, 1995).
RAPRA Technology Ltd., Polymeric Materials for Electrostatic Applications (1996), pp. 44–92.
Proceedings of the Multi Chip Module Conference, "Capacitive Coupling Solves the Known Good Die Problem," Salzman, D. et. al., Santa Cruz, Mar. 15, 1994, pp. 95–100, Institute of Electrical and Electronics Engineers.

* cited by examiner

Primary Examiner—Jeffrey Gaffin
Assistant Examiner—John B. Vigushin
(74) Attorney, Agent, or Firm—Slater & Matsil, L.L.P.

(57) ABSTRACT

A system for connecting a combination of substrates, including chips, components, printed-circuit-boards and multiple-chip-modules to each other. The system includes a half-conductive layer forming a resistive network sandwiched between the mating substrates. The half-conductive layer has sufficient conductance to allow electrical coupling between mating electrodes on the substrates, and sufficient resistance, to stay below the maximum specified cross-talk level between non-mating electrodes. The connection system can be used to connect light emitting sources with integrated circuits, detectors to integrated circuits and two integrated circuits of the same or possibly different technology to each other. Connection of integrated circuits to printed circuit boards (PCBs) and multi-chip modules (MCMs) is also supported.

18 Claims, 15 Drawing Sheets

METHOD AND APPARATUS FOR COUPLING CIRCUIT COMPONENTS

FIELD OF THE INVENTION

The invention relates generally to the field of electronic and microelectronic packaging, and in particular how to connecting multiple substrates, chips or die to each other through a half-conductive layer forming a resistive network. Methods for power transport and signal communication through the half-conductive layer, methods for making and application of the half-conductive layer, and methods for testing and repairing such systems are contemplated.

BACKGROUND OF THE INVENTION

Prior methods for connecting two substrates involved the use of conductive, metallic interconnections such a solder bumps between mating electrodes on the substrates. Before connection, solder or a complex metallurgical mix of metals is deposited on the electrodes by plating or by screen-printing. The substrates are then aligned such that mating electrodes and their associated solder bumps are in contact, followed by heating and compression. The solder melts and makes a galvanic contact. A disadvantage is that the resulting metallic interconnection is brittle. Temperature cycling induces cycled strain which may induce microscopic cracks and defects in the brittle solder bumps to grow. Eventually one large crack may expand across the whole solder-bump area, and the electrical connection between the mating electrodes is broken. Additionally, moisture and corrosion can also contribute to the growth of micro-cracks and to resulting undesired open circuits between mating electrodes. The yield and reliability of solder-bump interconnection is degraded by these phenomena.

An additional disadvantage of prior art solder bump interconnects is the limited number of channels (between mating electrodes) per square centimeter, since the solder islands require adequate spacing. Furthermore, several extra lithography steps are required on both mating substrates to form the solder bumps, making the system more costly. The low reworkability and low detachability is a bad property at system assembly time. Because it is difficult if not at times impossible to detach chips interconnected using solder bump technology, the failure of one of a set of chips may render the total system valueless. As a result chips need to be tested thoroughly before connection with solder bump technology. As chips become more complex and exhaustive testing becomes more difficult or nearly impossible, detachability becomes even more important. Moreover the solder-bump process is a dirty process with solvents and solder-flux. Processed parts require cleaning, and the use is restricted to high-temperature substrates.

Many of the problems linked to the metallurgy of the solder are solved using conductive polymer bumps. The conductive polymer bump technology however requires that the conducting polymer bumps are isolated completely from each other, to avoid short-circuiting. This limits the number of channels per square centimeter and requires precise lithography or screen-printing ability, thus increasing the cost and size of the interconnection. Additionally, at the moment of connection, the pressure (in grams/pad) has to be controlled carefully, not to squash the bumps flat, which in turn creates shorts. The bump formation process limits the material choice. Bumps require precise height. To obtain a solid construction, an under-filling material is required. The layer connecting the two substrates with conductive polymer and under filling material is macroscopically inhomogeneous, creating stress on the conductive polymer bumps and the underlying substrate. It is advisable, therefore, not to put circuitry below the conductive polymer bumps.

A homogeneous layer can connect opposing metallic pads through capacitive coupling. Systems are known in which one plate of a capacitance is formed on a first substrate and the other plate is formed on a second substrate. The resulting coupling capacitance is then used as a feed-through capacitance for signals and ac power. Such a system allows in principle a high number of interconnects, or channels, per square centimeter. The interconnect layer must have a high dielectric factor, which limits the number of usable materials. To obtain sufficient coupling the thickness of the interconnect layer should be very thin. To transmit signals through the capacitive interconnect layer, the signal edges have to be very steep for the signal to get transmitted since the low frequency part of a signal is filtered out. As a consequence, dc power cannot be transmitted through capacitive coupling.

Connection of a chip to a multi-chip module (MCM) substrate or a printed circuit board (PCB) involves additional wiring on the MCM or PCB, which wiring is typically several pF/cm, much more capacitive then the interconnect feed-through capacitance and forms a voltage divider therewith. As a result, only a small fraction of the transmitted signal voltage passes to the receiving detector, diminishing the voltage swing of the received voltage to unacceptable levels. A solution to this disadvantage requires the use of transmission lines with integrated termination resistors, and permanent dissipating receivers. Another attempt to work without a patterned layer and to avoid associated lithography costs, is the use of an anisotropic conductive adhesive. The adhesive base material contains metal particles of a certain diameter (e.g. 10-micron). When the substrates are brought in alignment, the distance between mating metal pads on the substrates is expected to be a little thinner than the diameter of the conducting particles. In this way, the conducting particles get compressed, forming a galvanic connection path between the mating pads. In the lateral direction, the particles do not touch each other, avoiding electrical connection between neighboring pads. In other words, in the direction normal to the layer there is conductivity; in lateral directions, there is electrical insulation. The disadvantage with that solution is that spacing between the mating pads has to be carefully controlled. Stresses resulting from compressing the conductive particles in the connection layer will concentrate locally, i.e. at the contact interface between the conductive particle and the metal pad. This force may damage any circuitry on the substrate below the metal pad. The thickness of the layer in between metal pads needs to be smaller than between insulation regions. When connecting CMOS chips, this will require extra plating for the metal pads to reach higher than the surrounding capping layer. Furthermore, the interconnect-pitch is determined by the statistics of the metal particles. For reliability reasons, at least a few particles should share the connection current. Hence, the metal pads must be of sufficient geometry to contact several conductive particles, thus increasing the size of the pads.

SUMMARY OF THE INVENTION

The invention provides for a system or circuit comprising electronic components. A first electronic component has a plurality of electrical contact pads and a second electronic component also has a plurality of electrical contact pads. At least one of the plurality of electrical pads on the first component is substantially aligned with one of the plurality of contact pads on the second component. An isotropically conductive layer between the first and second components couples the first and second plurality of contact pads. Alternatively, two separate unpatterned conductive layers may be employed, the layers being of essentially equal thickness and adjacent one another, but electrically isolated from one another. One layer electrically connects a first plurality of contact pads on the first component to a first plurality of contact pads on the second component, and the second layer couples a second plurality of contact pads on the first component to a second plurality of contact pads on the second component.

DESCRIPTION OF THE PREFERRED EMBODIMENTS

The following paragraphs discuss the wanted and unwanted conductances present in the half-conductive layer of the preferred embodiments. The material for the half-conductive layer and methods of applying same are provided. Several preferred embodiments are discussed in the context of interconnecting two chips and exchanging digital information.

Wanted and Unwanted Conductances

Figure 1A:
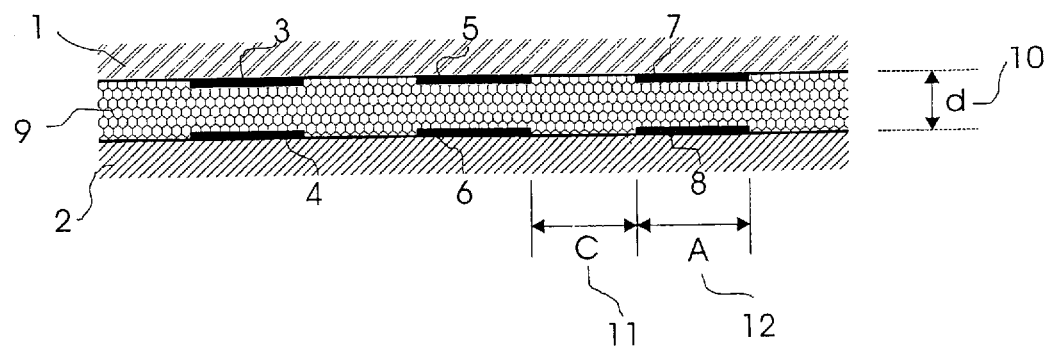
FIG. 1(A) is a cross-section of two substrates containing mating pads connected together through a half conductive layer.

FIG. 1(A) shows a cross-section of substrates 1 and 2 flip-chipped together with a half-conductive layer 9 interposed between them. Half-conductive refers to the conductive efficiency of layer 9 and implies that layer 9 is only partially or resistively conductive. Substrates 1 and 2 are preferably CMOS integrated circuits, but may include other types of integrated circuits (ICs) such as optoelectronic ICs, flexible or rigid PCBs, ceramic substrates, substrates for MCMs, or some combination of the above. Both substrates contain conductive pads electrically connecting the half-conductive material. The pads are preferably metallic contact pads connected to circuitry contained on the substrate or IC (not shown). Substrate 1 is shown with pads 3, 5 and 7, substrate 2 with pads 4, 6 and 8. Pads 3 and 4 are mating pads, i.e. are configured to be electrically coupled for signal or power transmission therebetween. Similarly pads 5 and 6 and pads 7 and 8, respectively, are mating pads.

Preferably, the two mating pads are positioned to essentially oppose each other, one on a first substrate, and the other on a second substrate when the substrates are aligned. If a pair of pads do not mate, they are called non-mating pads. In a preferred embodiments information and/or energy is sent from pad 3 to its mating pad 4. This requires that the half-conductive layer 9 has sufficient conductivity to pass the signal through. Note that the signal will also pass through half-conductive layer 9 to non-mating pad 6 (and other non-mating pads as well) through lateral conduction. To attenuate this cross talk the half-conductive layer 9 should be less conducting. This demonstrates the conflicting requirements for the half-conductive layer. On the one hand, the layer needs to be sufficiently conductive to pass signals between mating pads without excessive loss. This is the "wanted conductance." On the other hand, the layer needs to be resistive enough to attenuate cross-talk between neighboring, non-mating pads resulting from "unwanted conductance.".

In the following paragraphs we calculate the expected wanted conductance $G_w$ and the expected unwanted conductance $G_{uw}$ as functions of the pads topology. For this purpose we define the pad's width A (12) and length B (30), thickness of the half-conductive layer d (10), and the lateral separation between neighboring non-mating pads C (11), as shown in FIGS. 1(A) and 1(C). For the purpose of clarity we hereby assume that all pads have same width, length, separation and that the half-conductive layer's thickness is constant. One skilled in the art can extend this regular pad topology to a custom pattern and calculate the approximate values of all definable mutual conductances.

Figure 1B:
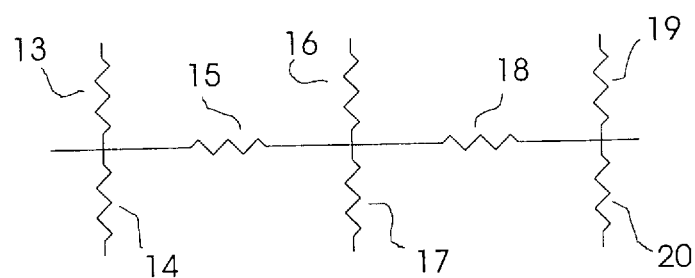
FIG. 1(B) is a schematic representation of the half conductive layer of FIG. 1(A).
Figure 1C:
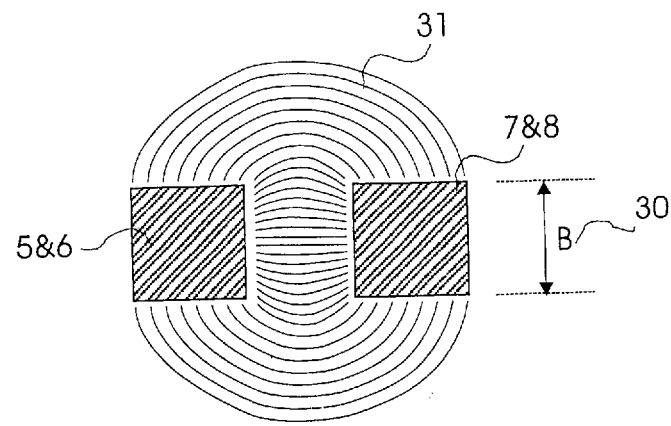
FIG. 1(C) illustrates in top view the field lines between two couples of adjacent mating pads of FIG. 1(A) when held at different voltages.

The regular pattern illustrated in FIG. 1(A) results in a distributed half-conductive network that can approximated by a lumped resistor (or conductance) network model for the half-conductive layer 9, as shown in FIG. 1(B). Conductance 13 and 14 represent the wanted conductance between mating pads 3 and 4. Conductance 15 represent unwanted conductance between the couple of mating pads 3 and 4 and the couple of mating pads 5 and 6, which unwanted conductance results in cross talk between the couples Similarly, conductance 16 and 17 represents the wanted conductance between mating pads 5 and 6. Conductance 18 represents the unwanted conductance between the couple mating pads 5 and 6 and the couple of mating pads 7 and 8. Conductance 19 and 20 represents the wanted conductance between mating pads 7 and 8.

The wanted and unwanted conductances can be calculated very precisely by numerical methods, e.g. with the finite element method. A person skilled in the art can make such computer simulations. These values can be approximated with sufficient accuracy, as follows. The wanted conductance $G_w$ can be estimated by $$G_W = g \frac{A \cdot B}{d} \quad (1)$$

where A, B and d are defined above and g is the volume conductivity of the half conductive layer in (Siemens/cm) or (mho/cm). The volume conductivity is the inverse of the volume resistivity in (ohms/cm). The unwanted conductance $G_{uw}$, is estimated by $$G_{UW} = g \cdot \alpha \cdot \frac{B \cdot d}{C} \quad (2)$$

where g, B, d and C have been defined previously, and where $\alpha$ is a fringing coefficient with a value essentially between 1 and 3. FIG. 1(C) illustrates the need for this coefficient. FIG. 1(C) provides a top view of the electrical field lines 31 between the mating pad couple 5 and 6 and the mating pad couple 7 and 8 when the couples are held at different voltages. If there were only horizontal field lines, one would obtain an $\alpha$ of 1. However, there are also fringing field lines, increasing the expected current at a given voltage difference. The unwanted conductance is therefore a little larger, reflecting the necessity to include the a coefficient in Equation 2.

An interesting measure to obtain a quick estimation of the expected influence of one mating couple of pads to its neighboring couple, is the isolation ratio $$\frac{G_W}{G_{UW}} = \frac{1}{\alpha} \frac{A \cdot C}{d^2} \quad (3)$$

For A=B=C=100 micron, d=5 micron, and $\alpha$=2 the isolation ratio equals 200. This implies that the strength with which the mating pads are connected to each other is at least 200 times higher than the strength of connection between non-mating pads. Or in general, one can say that larger pad area, larger lateral separation between the pads, and a thinner half conductive layer are beneficial for this isolation ratio. A thinner half-conductive layer helps as well the wanted conduction to increase and the unwanted conduction to decrease. Note that the isolation ratio is essentially independent of the conductivity of the half-conductive layer. Preferably, the isolation ratio should be at least 10 in order to achieve acceptable levels of signal transmission without excessive levels of cross-talk. With an isolation ratio of 10, the cross-talk signal would be about ten percent of the desired signal, which is within an acceptable range for typical applications using digital signals.

Figure 2A:
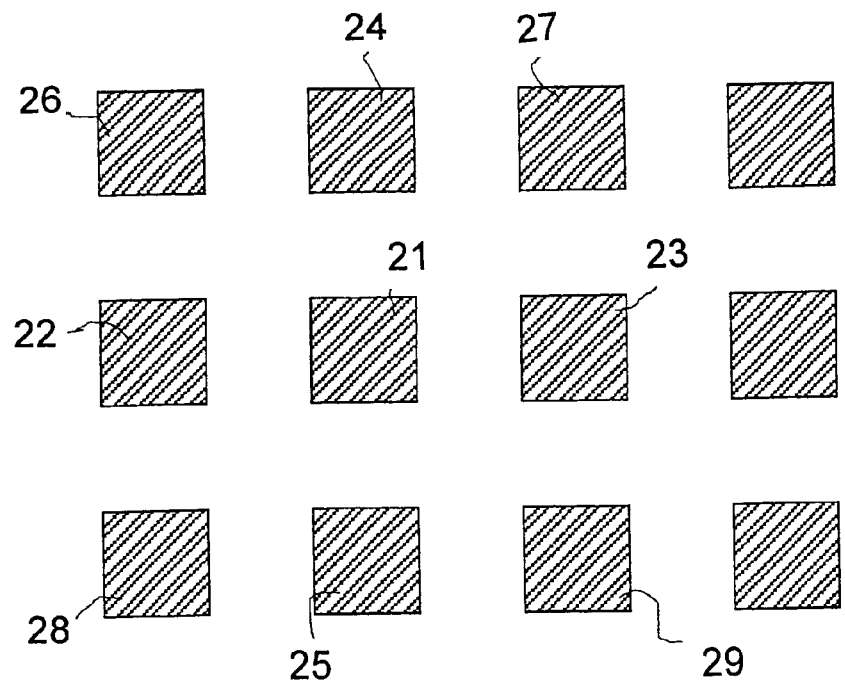
FIG. 2(A) is a top-view of mating pads arranged in a first preferred arrangement.

FIG. 2(A) shows in plan view the top mate of a series of couples of mating pads. Each pad 21, 22, 23, etc. has a mating pad located beneath it (not shown). To estimate the effective disturbance, or cross talk, a mating pad couple is subject to, all the neighboring mating pad couples neighbors should be taken into account. For example, pad 21 and its corresponding mating pad are subject to a first order level of unwanted conductance with the mating pads 22, 23, 24 and 25 (and their respective mating pads). Pad 21 and its mating pad are also subject to a second order level of unwanted conductance arising from the signals from mating pads 26, 27, 28 and 29 (and their respective mating pads). Further orders of neighboring pads can also be taken into account, however their effect on pad 21 becomes significantly attenuated as the distance from pad 21 increases (and as the effect of other pads between them and pad 21 tends to cancel some of their effects). Focusing on the eight pads surrounding exemplary pad 21 provides a sufficient approximation of the cross talk to which pad 21 is subject. Maximum cross talk will be generated when the eight neighboring pads 22, 23 . . . 29 change voltage at the same time, to the same voltage level, which voltage level is different than that at which pad 21 is maintained. The effect of the unwanted conductance is then multiplied by approximately 4+4/$\sqrt{2}$=6.8. In other words, four of the neighboring pads are spaced apart from pad 21 by one unit length, whereas the other four (diagonally) neighboring pads are spaced apart from pad 21 by approximately 1.414 (taking the distance between the center points of pads 21 and 23 as a unit length, the distance between pad 21 and pad 27, being the hypotenuse of a right triangle formed by pads 21, 23 and 27, would be $\sqrt{2}$ times the unit length). These four diagonally neighboring pads, being spaced further from pad 21, would have proportionately less influence on pad 21.

Figure 2B:
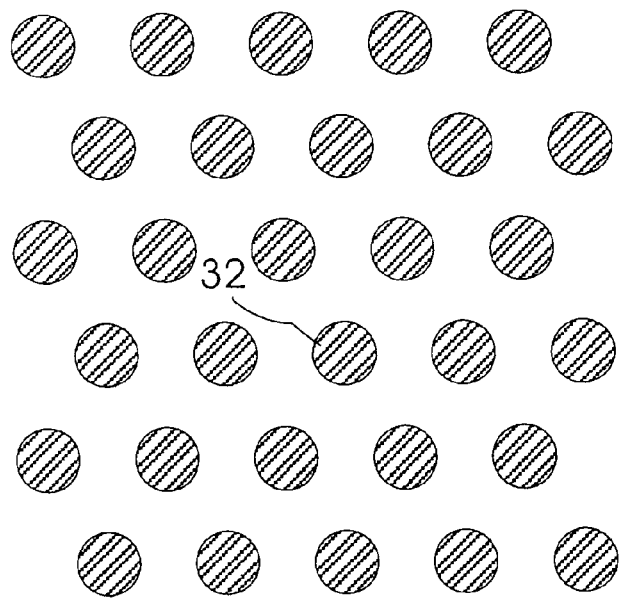
FIG. 2(B) is a top-view of mating pads arranged in a second preferred arrangement.

FIG. 2(B) shows an alternative top view layout of mating pad couples. They differ in the previous example by their shape, and by their placement in a hexagonal structure. Note that in the alternate arrangement, exemplary mating pad 32 is circular and has six first order neighbors. With this arrangement, the effect of the neighboring pads would be multiplied by approximately six, the effect of the other pads being negligible on pad 32.

In a typical application, a minimum value of wanted conduction would be specified together with a maximum value of unwanted conduction. These requirements define the application's conductance requirements. A combination of width A, length B, separation C and thickness d defines the pad topology. When selecting a half-conductive material for a given application, the material is chosen such that its volume conductivity value falls within a certain volume conductivity window.

The application's conductance requirements, the pad topology and the volume conductivity window are interrelated. One can always find a pad topology for given application's conductance requirements and a given volume conductivity window. Only when the wanted conductance is infinite or the unwanted conductance is zero this can theoretically not be achieved. Given a pad topology and the application's conductance requirements, the acceptable volume conductivity window can be determined. However, if the requirements for pad topology and the application's conductance requirements are too stringent, there may be no materials that would satisfy the volume conductivity window. Or the volume conductivity window may be so narrow that it would be difficult to make a half-conductive material with sufficient homogeneity to satisfy the requirements. Volume conductivity constrained can be relaxed, however, by applying principles of guarding and bootstrapping as explained below.

As discussed above, a quick estimation of the cross-talk from one mating couple of pads to a neighboring mating couple of pads is given by the isolation ratio. Preferably, however, further improved performance can be obtained from the use of different pad areas for the sending and receiving pads in a mating couple, as will be discussed in the following paragraphs. The discussion regarding the use of different pad areas is equally applicable to the other various embodiments described herein.

Figure 10A:
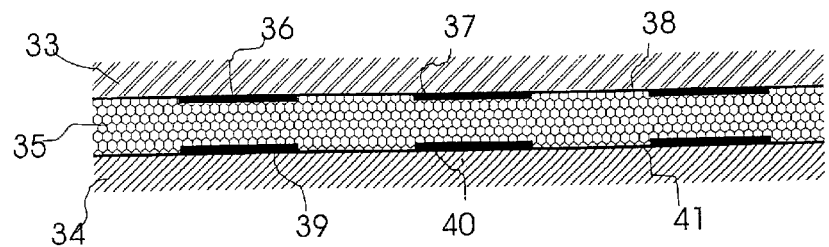
FIG. 10(A) is a cross section of two substrates having same sized mating pads.

FIG. 10(A) shows three couples of mating pads (36 and 39, 37 and 40, and 38 and 41), each with the same pad area. The isolation ratio for this geometry is approximately four, (assuming $\alpha=1$, $A=C=2$, and $d=1$, and using Formula (3), supra. This isolation ratio is relatively poor, and would not provide satisfactory digital signal transmission characteristics between substrates 33 and 34.

Figure 10B:
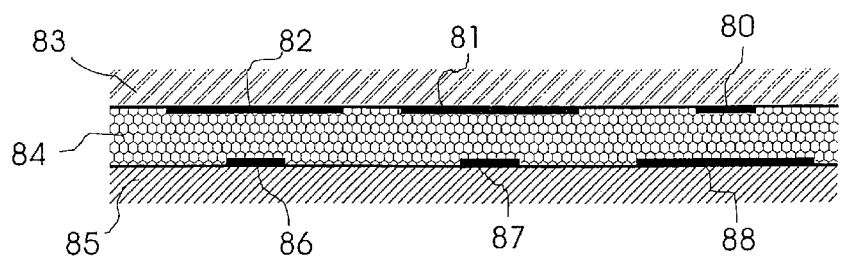
FIG. 10(B) is a cross section of two substrates having different sized mating pads.
Figure 10C:
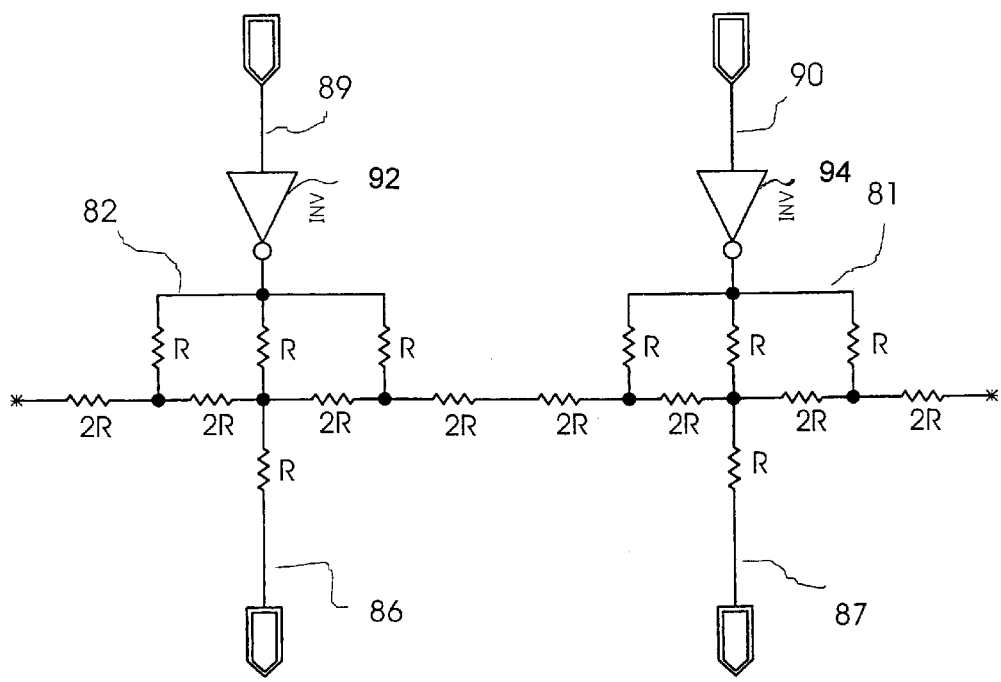
FIG. 10(C) illustrates schematically the circuit of FIG. 10(B).

FIG. 10(B) shows three couples of mating pads (82 and 86, 81 and 87, and 80 and 88) spaced with the same lateral pitch as the couples in FIG. 10(A), and separated by a half-conductive layer with the same thickness, d, as shown in FIG. 10(A). Note, however, that in FIG. 10(B), pads 82, 81, and 88 are three times as wide (i.e., A is three times larger) as their mating opposing pads 86, 87, and 80, respectively. FIG. 10(C) schematically illustrates couples 82, 86 and 81, 87 of FIG. 10(B). For clarity, mating couple 80, 88 is not shown in FIG. 10(C). As shown in FIG. 10(C), each pad 82 and 81 is driven by an inverter 92 and 94, respectively. Each inverter is coupled to a 5V Vcc supply voltage and has a low output impedance. Half conductive layer 84 is schematically illustrated as a resistive network, a lumped first order approximation.

Assume that node 89 is high (5V) and node 90 is low (0V). Inverter 92 will drive pad 82 low and inverter 94 will drive pad 81 high. Circuit modeling indicates that the voltage level appearing 86 (which is mated to low voltage level pad 82) is approximately 200 mV, whereas the voltage level transmitted to pad 87 (coupled to high voltage level pad 81) is approximately 4.8V. In other words, the signals appearing at pads 82 and 81, respectively, are only degraded by 4%, well within acceptable levels for signal transmission.

The low disturbance of one mating pad couple on its neighboring pad couple in FIG. 10(B) is due to a screening effect resulting from the large size of pads 82 and 81 relative to pads 86 and 87, respectively. The low impedance pads 82 and 81 influence the voltage in the half-conductive layer 84 across an area that is larger than the area of receiving pads 86 and 87, respectively. In this way, the influence of neighboring pads is minimized. Preferably, therefore, the sending pad area is at least twice as large as the area of its receiving pad mate. An additional benefit is that such a pad topography allows for greater tolerances in the alignment between substrates 83 and 84, while minimizing cross-talk between neighboring pad couples due to misalignment.

Half-conductive Material

Several half-conductive materials are known in the art. For instance, ways to fabricate half-conductive materials and application techniques are taught in *Polymeric Materials for Electrostatic Applications*, Rapra Technology Ltd. (October 1996) which reference is incorporated herein by reference. That Some of the information taught therein is given in the following paragraphs for reference.

A first preferred type of half-conductive material is intrinsically conducting polymer. An intrinsically conducting polymer conducts current due to impurity dopants that are attached to the polymer strings. The polymer strings themselves conduct charges. These materials include polypyrrole, polyaniline, and polyacetylene.

An alternative preferred half-conductive material is formed from a base material with a high volume resistivity to which is added a conductive filler. The conduction mechanism is based on charges moving or tunneling from one conductive particle to neighboring conductive particles. The base material may be formed of polymers, many types of adhesive, plastics, thermoplastics, thermoset materials, elastomeres, epoxies, and pastes. Many types of conductive fillers can be used including carbon black, metal powders, nickel-coated graphite and silver coated glass spheres. Essentially, the higher the filling content is, the higher the reached volume conductivity will be. This relation is essentially monotone, but not linear. Preferably the half-conductive layer will be of uniform volume conductivity. The conductive filler is expected to be distributed homogeneously in its base material. A fluctuation in homogeneity will cause a fluctuation in volume conductivity. This is acceptable, as long as the conductivity of the half-conductive layer stays within the presumed volume conductivity window.

The volume conductivity of electrically conductive polymers presently used for the polymer bumped flip-chip interconnect is very high, typically between $10^3$ and $10^6$ Siemens/cm. Electrically conductive elastomers with high volume conductivity are also commercially available. Such elastomers can be obtained from the company "Instrument Specialties" under the trade name of Electrically Conductive Elastomer (ECE)and are employed in high frequency applications, such as wireless communications, to provide for compliance with electromagnetic compatibility (EMC) regulations. Elastomers filled with Ag/Ni, Ag/Al, Ni/Graphite and Inert Aluminum are commercially available and provide for volume conductivities of 0.1 to 200 Siemens/cm.

These conductive polymers and elastomers are both optimized to achieve high conductivity. Depending on the intended use, the desired volume conductivity may be different from the volume conductivities of these commercially available materials. For lower volume conductivity it is sufficient to lower the content of conductive filling material.

For some applications, good thermal conduction in the half-conductive layer is required. Heat conducting paste, like the paste used to thermally connect transistors and integrated circuits with heat sinks can serve as the base material. This paste is usually electrically insulating. Conductive fillers can raise the volume conductivity to the required level.

For other applications it is desirable that the two mating substrates can glide with respect to each other in order to avoid shear stress resulting from different thermal expansion coefficients of the substrates. For this purpose, a half-conductive paste or liquid is preferable. Again, conductive fillers can supply the required conductive properties to the liquid or paste. When using a liquid or paste as the half-conductive layer, sealing around the periphery of the substrates may be necessary. Sealing can prevent the liquid and the paste from leaking out from between the substrates and can seal out moisture and contaminants. Exemplary preferred sealants and encapsulants are commercially available from the Dexter Corporation under tradenames Hysol EO1060, Hysol EO1061, and Hysol FP4401.

Alternatively, the use of an elastomer for the half-conductive layer can also ameliorate shear stress and avoid reliability problems as the elastomer layer will deform in the event of uneven thermal expansion between the two substrates. The thicker the elastomer half-conductive layer is, the more mismatch in thermal expansion that can be tolerated. As discussed above, however, wanted conductivity varies inversely with the layer thickness.

Application of the Half-conductive Layer

The half-conductive layer should be free of large cavities. A cavity is defined as a volume where there is no half-conductive material present. Instead of the half-conductive material can be air, an outgas of a polymer or vacuum. Cavities may form within the half-conductive layer, or between the half-conductive layer and one or both of the substrates. Small cavities, e.g. in the form of bubbles, can be tolerated provided they are significantly smaller than the pad's width and length, A and B, and the half-conductive layer's thickness d. Large cavities, however, decrease the wanted conductance and can degrade performance, particularly, where mating pads require a minimum value of wanted conductance.

When using a liquid or adhesive (in liquid form before curing) half-conductive layer, a way to obtain a uniform layer between the two substrates with low cavity content is by the process of under-filling. An adhesive half-conductive layer is available from Effshield Company, under product code 41-9219. A difficulty with liquid half-conductive layers is that, over time, the conductive particles may settle down to the bottom of the layer. Preferably small metallic particles in range of 100 nm diameter are used in the liquid medium to minimize the settling down effect. An alternative preferred approach is to from a dispersion of conductive particles in the liquid medium, such as using polyaniline as the conductive particles in an appropriate solvent, such as Xylene. Polyaniline is available from Zipperling Kessler & Co. When a layer of air separates the substrates, a liquid provided at the side of the air gap will fill the volume due to the capillary effect. If the surfaces (including the pads) of both substrates are sufficiently wettable for the liquid used, an essentially cavity-free layer can be achieved. Another preferred method for obtaining a cavity-free half-conductive layer is apply the layer to a first substrate and to engage the second substrate at an angle, then slowly tilt the second substrate into the horizontal position such that air can escape during the positioning. Again, a necessary condition for this method is that both substrates are sufficiently wettable for the given liquid. After the liquid layer is present in between the substrates, the substrates can be pressed together, if wanted, lowering the thickness d of the half-conductive layer. As discussed above, the isolation ratio, being the ratio of wanted conductances to unwanted conductances, varies inversely with the square of the distance, d. One skilled in the art will recognize that proper alignment between the substrates may require that the substrates be held in place laterally as the substrates are brought together.

If the half-conductive layer is formed from an adhesive, permanent fixture of the substrates can be obtained by curing the adhesive. With a liquid half-conductive layer that is expected to remain in the liquid phase, a sealant is necessary, as discussed above. This prevents the liquid from leaking away, and from attracting unwanted contaminants from the surrounding environment. The sealant can be employed to completely encapsulate the smaller of the two substrates or can simply seal the perimeter around the substrates. Materials for encapsulation or for similar purposes are well known to the person skilled in the art of electronics packaging. Exemplary preferred sealants and encapsulants are commercially available from the Dexter Corporation under tradenames Hysol EO1060, Hysol EO1061, and Hysol FP4401. Preferably, the sealant material is somewhat elastic, thus allowing for different coefficients of thermal expansion between the two chips or substrates being interconnected. As discussed above, thermal cycling induces significant reliability problems with conventional solder bump interconnects. The use of liquid or adhesives for the half-conductive layer and elastic sealants avoids the reliability concerns prevalent in the prior art.

A paste of half-conductive material can be stencil printed to provide a layer with given thickness. Stencil printing is used frequently for connection of components to a PCB or MCM. With respect to the present invention it provides a way to define separate course areas with a half-conductive layer. The possibility to have separate course areas can be appreciated for example when operating at very low power. An unwanted conductance between power supply pads must be avoided completely for this purpose. Some adhesives are paste-like before curing. When the paste remains pasty in time, it allows the substrates to glide with respect to each other, accommodating differences in expansion. It is a low shear-stress solution. A paste can also be made thermally conductive by adding, e.g. alumina (aluminum oxide). Or the base material for making the half-conductive material can be a thermally conductive paste. A silicon based, conductive paste with a volume resistivity of 10–30 ohms-cm is available from Nusil Technology Company under the product code R-2631. Sealing can protect the construction, combining the substrates permanently, as discussed above.

A foil of half-conductive material can serve as the half-conductive layer. When the base material is thermoplastic, the foil can be sandwiched between the two substrates. Fixing the foil to both substrates is obtained by appropriately heating the assembly.

Similarly, a half-conductive coating can be present on one or both of the substrates, such that only aligning and appropriate heating is required to combine the substrates together. Coating methods include spin coating, spray coating, extrusion coating, and painting. An example of a half-conductive layer suitable for coating or painting is commercially available under the tradename ORMECON-Lacquers, from Zipperling Kessler & Co., Germany. For stress sensitive systems, a thick material can be used to relief shear stress as discussed above, or the base material for the half-conductive layer can be of the elastomer type.

Figure 3A:
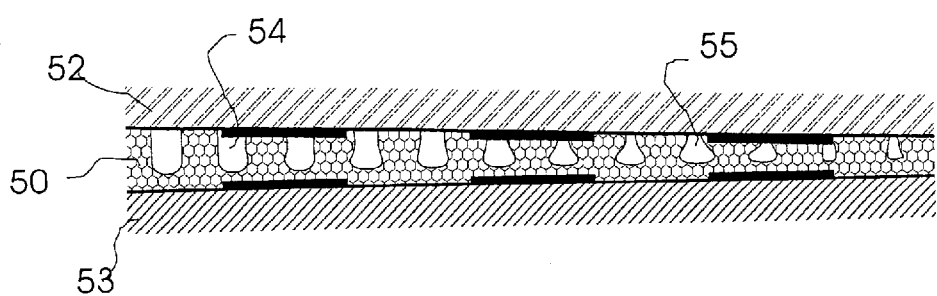
FIG. 3(A) is a cross section of two substrates containing mating pads connected together through a micro-patterned half-conductive layer.

Substrates can show some bowing, or they can be rough. For example, a PCB is not micrometer-smooth at its surface. If the half-conductive layer is formed of a foil (or coating) having a fixed thickness, unwanted cavities may result from connecting rough (or bowed) substrates. Using a micro-perforated or micro-patterned half-conductive foil (or coating) whereby the perforations (or patterns) are small with respect to the pad's width and length compensates for non-uniform substrates. FIG. 3(A) illustrates a micro-patterned half-conductive layer 50 between substrates 52 and 53. At areas where the foil is compressed from, e.g. a high spot on the surface of substrate 52, perforations 55 will deform and shrink under pressure. Other perforations, 54 corresponding to a low spot on the surface of substrate 52 are not significantly compressed. In an alternative embodiment, the half-conductive layer is formed of a foil constructed with integrated air bubbles. These bubbles can provide the deformation provided by the perforations shown in FIG. 3(A) provided the bubbles dimensions are small with respect to the pad's dimensions.

Figure 3B:
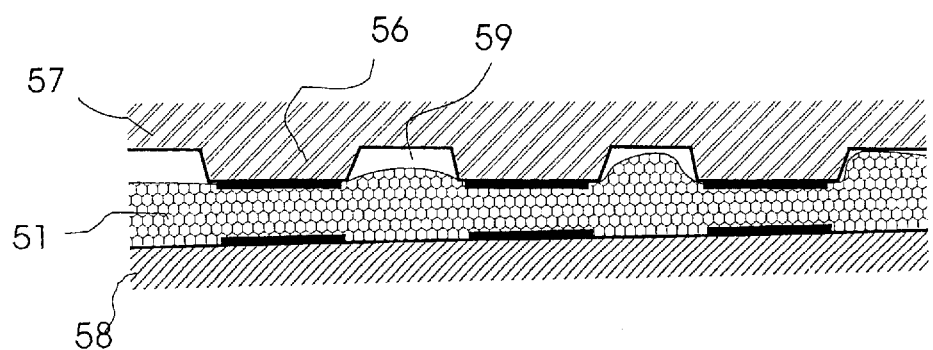
FIG. 3(B) is a cross section of a first substrate containing mating pads on mesa-like structures connected to mating pads on a second substrate through a half-conductive layer.

Alternatively, the substrates themselves can be patterned. Reference is made to FIG. 3B where substrate 56 is patterned. The contact pads, e.g. pad 56 are located at the top of the mesas formed on the surface of substrate 57. The mesas can be formed by building up substrate material at the mesa sites, or by etching or mechanically grinding channels in the substrate between mesa sites, as is known in the art. When substrates 57 and 58 are pressed together, half-conductive layer 51 is subject to compressive stress. This compressive stress is relieved as half-conductive layer 51 bulges out into the space provided between the mesas in substrate 57. In this way, good electrical contact is maintained between the pads and the half-conductive layer, without imposing undue force on circuitry on the surface of the substrates or located beneath the pads. Alternately, both substrates 57 and 58 can be patterned with a series of mesas.

Figure 3C:
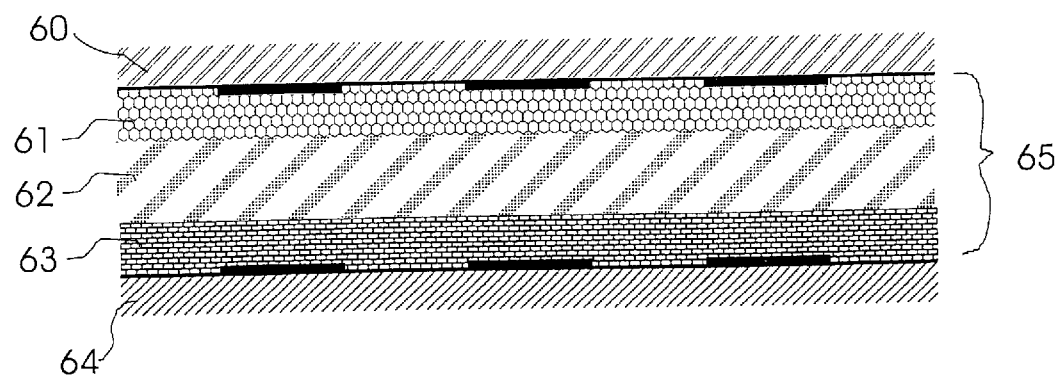
FIG. 3(C) is a cross section illustrating a multi-layer half-conductive layer.

When all pins of a substrate are connected to each other through a resistive network, as illustrated in FIG. 1(C), 3(A) and 3(C), electrical charge build-up is discouraged. Still, if electrostatic discharge (ESD) occurs, its associated current is spread across all the pins, and the possibility that this irreversibly destroys the substrate or circuitry contained thereon is minimized. A half-conductive coating inherently forms such a resistive network. One of the last steps in the IC fabrication can hence be the application of a half-conductive layer. The higher the conductivity of the half-conductive layer, the better the ESD protection. With sufficient ESD-protection achieved this way, the conventional (area consuming) ESD-protection circuits at the input and the outputs can be omitted. For instance, as shown in FIG. 3(C), ESD protection half-conductive layer 61 provides a resistive network interconnecting the conductive pads formed on substrate 60. Likewise, ESD protection half-conductive layer 63 forms a resistive network interconnecting the conductive pads formed on substrate 64. Layers 61 and 63 are interconnected through half-conductive layer 62. Together, layers 61, 62, and 63 form a multi-layer half-conductive layer that provides for all the advantages of the preferred embodiments discussed above, including ESD protection.

An important issue in the assembly of electronics systems is the detachability of parts. When connecting multiple die or chips on a PCB or MCM substrate, the failure of one die or chip will render the total system useless when this die cannot be removed from the PCB or MCM and replaced. Preferably, the known bad die should be detached and replaced by a working die. If this is possible, the total yield increases significantly, which is an important product cost improvement. With solder-bump technology, as discussed above, the detachability is poor because of the difficulty of obtaining new solder-bumps with the appropriate metallurgical composition and shape. Such reworking typically requires additional lithography or plating steps, with the concomitant yield loss and risks of contamination discussed above.

The preferred embodiments of the present invention provide for improved detachability. For instance, with a liquid or adhesive half-conductive layer chips can be readily separated from a PCB or MCM prior to the chip being sealed in place or the adhesive being cured. In case of half-conductive paste, foil or coating, detaching can be obtained by pulling the substrates apart (while heating, when thermoplastic foil or coating is used). Cleaning and applying new paste, foil or coating may be necessary. When using a foil or coating, careful heating from one side will detach one substrate first alleviating the necessity of cleaning and application of new half-conductive material. Also some built-in preference of the foil or coating to one of the substrate materials may help to keep the foil or coating intact when detaching. Such built-in preference may be imposed by the use of an adhesive promoter. Alternatively, an adhesive such as the "Cold Block" glue from Loctite Company may be incorporated into the base material for the half-conductive layer. This adhesive dissolves when exposed to soap-water (water+detergent) and allows the two substrates to be easily detached from one another.

Testability is also a major concern in the electronics industry. Easy detachability allows easy testing. With the present invention one of the substrates can be a chip under test with conducting pads for half-conductive coupling, and the other substrate a test structure with mating conducting pads on a test head. Positioning the test head on uncut die (a processed wafer), or on separate chips or die allows for low damage and fast testing and qualification of the chips or die under test.

Design Considerations for Several Alternative Preferred Embodiments

Chip to Chip Coupling.

Coupling two or more chips together via a passive MCM substrate or PCB degrades system performance in terms of speed signal transmission and energy dissipation. The wires on the PCB or MCM substrate introduce parasitic capacitances which have to be charged and discharged via large output buffers This wastes energy and causes unwanted heat dissipation. A typical MCM wire or trace introduces a capacitance of 2 pF/cm. When chips are flipped together, thus avoiding the need for an MCM, the wire is omitted, and signals stay virtually on chip, at least from the point of speed and energy dissipation.

Figure 4:
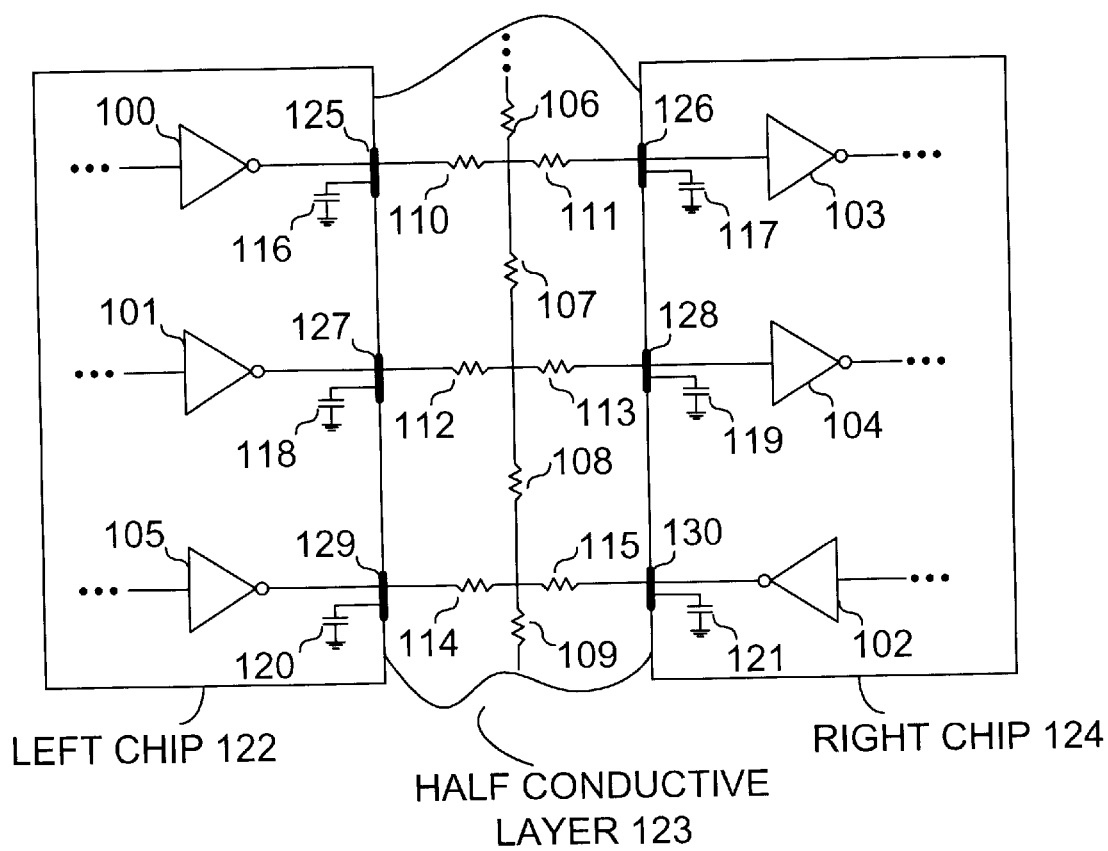
FIG. 4 illustrates schematically two integrated circuit chips interconnected through a half-conductive layer.

In FIG. 4, Left Chip 122 is shown connected to Right Chip 124 via Half-Conductive Layer 123. Left chip 122 contains inverters 100, 101 and 105. Inverters 100 and 101 drive signals from left to right, i.e. from Left Chip 122 to Right Chip 124. Inverter 105 receives signals coming from Right Chip 124. Right chip 124 contains inverters 103, 104 and 102. Inverter 102 drives signals from right to the left, inverters 103 and 104 receive signals coming from Left Chip 124. Capacitors 116, 117,118, 119, 120, and 121 represent parasitic capacitances formed essentially between the conductive coupling pads 125, 126, 127, 128, 129, and 130, respectively, and the substrate chip wiring underlying the pads. Half-conductive Layer 123 is modeled as a distributed resistive network, as represented by resistors 110, 111, 112, 113, 114, and 115 (which represent the wanted conductances) and resistors 106, 107, 108, and 109 (which represent the unwanted conductances).

The first signal path, or channel, is from left to right and consists of inverter 100, conductive pad 125, wanted conductance 110 and 111, conductive pad 126, and receiving inverter 103. This first channel is subject to cross talk, represented by unwanted conductances 106 and 107. Similarly, there is a second channel from left to right, consisting of inverter 101, conductive pad 127, wanted conductance 112 and 113, conductive pad 128, and receiving inverter 104. This second channel is subject to cross talk represented by unwanted conductances 107 and 109. A third channel, passing from right to left consists of inverter 102, conductive pad 130, wanted conductance 115 and 114, conductive pad 129, and receiving inverter 105. Signals on this third channel are subject to unwanted conductances 108 and 109.

The first issue is that parasitic capacitances 116, 117 . . . 121 delay the signal flow between the chips. Consider now the second channel from left to right. For pads of 100 micron by 100 micron, a typical induced parasitic capacitance is assumed of 100 fF. Inverter 101 can be designed to drive the first capacitance 118 in the signal path without significant delay. The second capacitance 119 in the signal path however induces a delay, primarily depending on the value of RC time constant of capacitance 119 and wanted conductance 112 and 113. Assuming a signal delay of 1 nanosecond is acceptable for the given system, and assuming that 86% of the transmitted signal change (voltage swing) at the input of inverter 104 is sufficient to change inverter's 104 output, a 2RC-delay can be used to calculate the desired value for wanted conductance 112 and 113. The sum of resistances 112 and 113, together forming the wanted resistance (the reciprocal of the wanted conductance) is then 5 kilo-Ohm. Or in other terms, the wanted conductance is $2\times10^{-4}$ Siemens. A larger wanted conductance induces a faster signal transfer. The total of the unwanted conductances disturbs the voltage at the input of the receiver inverter 104. Worst case is when the surrounding channels have the same state (e.g. digital LOW), and when the inverter 101 drives to the opposite state (e.g. HIGH). The sum of the unwanted conductances 107 and 108 forms a voltage divider with essentially conductance 112. Assuming the unwanted conductances are much smaller than the wanted conductance, an estimate of the voltage error at the input of inverter 104 is the voltage swing divided by the isolation ratio. Using the aforementioned example with A=B=C=100 micron, d=5 micron, and $\alpha$=2, the isolation ratio equals 200. With a power supply voltage of 3.3V, this voltage error is 16.5 mV, which indicates that the neighboring channels do not disturb the transmission of signals, for the given isolation ratio.

When neighboring channels have different logic states, there is a current leak via the unwanted conductance. In the present example, with an isolation ratio of 200 and a wanted conductance of $2\times10^{-4}$ Siemens, the unwanted conductance is $1\times10^{-6}$ Siemens. At Vcc=3.3 V, the leak is 3.3 microamperes. The associated DC power dissipation is then 10 microW. Having 200 channels, with alternating logic states (worst case) delivers 1 mW of DC power dissipation. For most applications, this leak can be tolerated. Typically, an integrated circuit, in the form of a micro processor dissipates several Watts of power. In standby it still dissipates several milliwatts. The milliwatt of leakage power associated the coupling technology can in most cases be tolerated.

Alternatively, the system illustrated in FIG. 4 can be configured to make use of the Return-To-Zero format (RTZ-Format) to minimize leakage current due to unwanted conductances. In the RTZ-Format, transmitting a positive pulse corresponds to the transmission of a logic HIGH, no pulse corresponds to the transmission of a logic LOW. In this way there are never opposite digital states between neighboring channels when no logic signals are being transmitted.

Figure 12A:
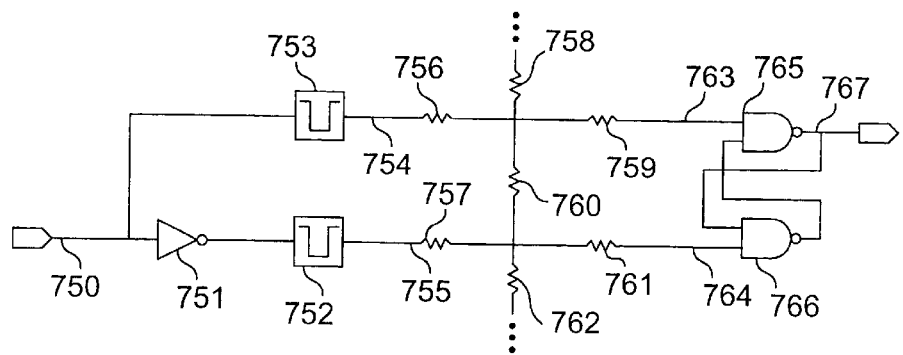
FIG. 12(A) schematically illustrates circuitry for communicating digital signals across a half-conductive layer using differential pulsing.
Figure 12B:
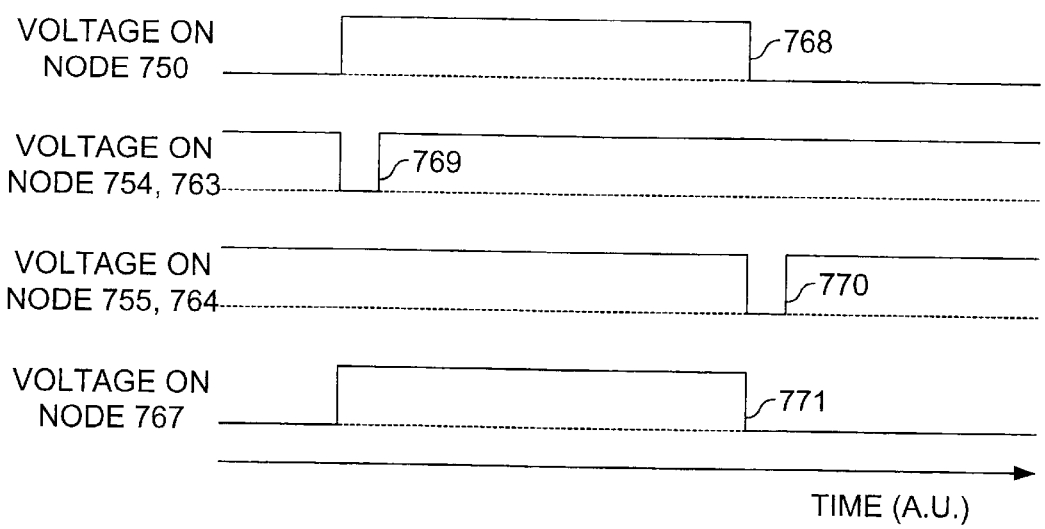
FIG. 12(B) illustrates voltage levels at various nodes of the circuit of FIG. 12(A).

An alternative pulse-based method for signal transmission is based on differential pulsing, as illustrated in FIGS. 12(A) and 12(B). This system requires two mating pad couples for every digital information channel. In FIG. 12(A), the half conductive layer is represented by its equivalent resistance network 756, 757, . . . 762. One-shot circuit 753 pulses low when the input signal on node 750 changes from digital LOW to HIGH, as illustrated by signals 768 (voltage on node 750) and 769 (voltage on node 754, which corresponds to a first contact pad) of FIG. 12(B). Similarly, the output of one-shot circuit 752 pulses low at a falling edge of input 750 (curve 770), driving node 755 (second contact pad) LOW. These pulses are transmitted through the half-conductive layer via the wanted conductances formed by 756 & 759 and 757 & 761 respectively. On the receiving chip, the flip-flop formed by NAND gates 765 and 766 holds the final state. Node 767 is driven LOW when 764 (corresponding to the mating pad for receiving signals from pad 754) is LOW, and is driven HIGH when 763 (corresponding to a mating pad for receiving signals from pad 755) is LOW. The reconstructed output voltage at node 767 is given by curve 771.

A third alternative method of transmission via pulses is single channel, non-differential. On every change in the logic input signal a short pulse is transmitted. A toggle flip-flop at the receiving side recovers the original digital input signal. It requires however that the output of the toggle flip-flop be synchronized at least once to give the right received digital bit. One can agree on some standard, whereby a short pulse toggles from LOW to HIGH and a longer pulse toggles from HIGH to LOW. The toggle flip-flop will deliver the new state with low latency, and at the end of the pulse, the new output can be verified and changed when found corrupt. This third alternative is preferable because it is low latency, single channel, and has no power dissipation when no signals are being transmitted. In this scheme the unwanted conductances are essentially inducing cross-talk, and for this a lower isolation ratio than 200 can be allowed. This widens the conductivity window of the half-conductive material. A wider conductivity window makes the half-conductive coupling more robust.

Figure 13A:
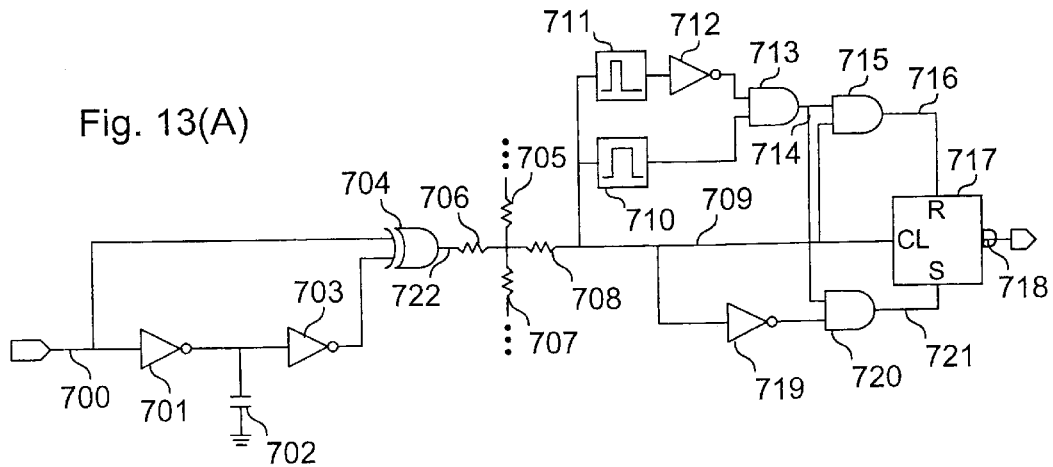
FIG. 13(A) schematically illustrates circuitry for communicating digital signals across a half-conductive layer using a return to zero format.
Figure 13B:
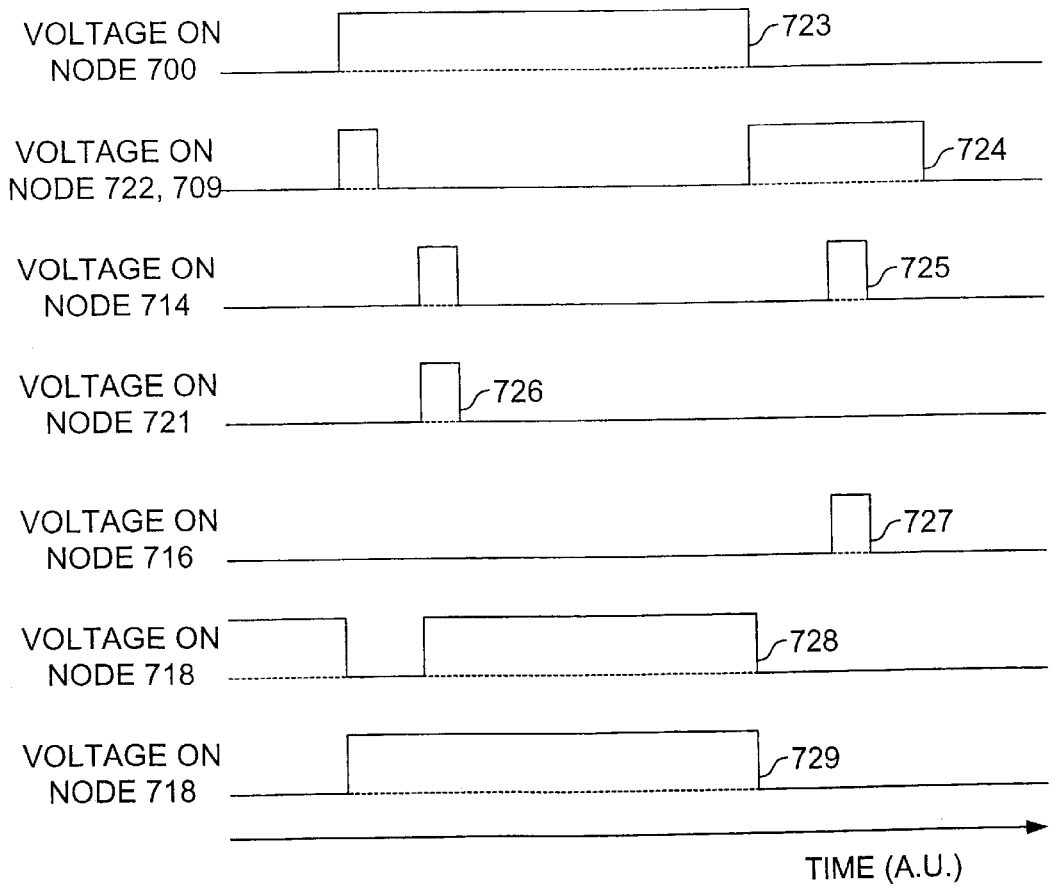
FIG. 13(B) illustrates voltage levels at various nodes of the circuit of FIG. 13(A).

This way of operation is further explained with reference to FIGS. 13(A) and 13(B). In FIG. 13(A) a logical signal at node 700 in the first chip is to be transmitted via the half-conductive layer to node 718 on the second chip. The signal goes to one of the inputs of Exclusive OR gate 704 immediately, and via inverters 701 and 703 to the other input of Exclusive OR gate 704. This is a known way to generate a short pulse on every edge of the digital signal at node 700. The capacitance 702 is considered to be used for broadening the pulses at the output 722 of the EXOR 704. To obtain different resulting pulse-lengths for a rising and a falling edge on node 700, the transistors incorporated in 701 can be chosen relatively asymmetric. By designing inverter 701 with a narrow width channel PMOS transistor, and a wide channel NMOS transistor, a short pulse is generated on node 722 for a rising edge on node 700, and a longer pulse is generated on node 722 for a falling edge on node 700 (as indicated by curve 724) of FIG. 13(B).

The half-conductive layer is symbolized by resistive network 705, 706 . . . 708. Output 718 of toggle flip-flop 717 at the receiving chip, is toggled between LOW and HIGH states at every rising edge of its input, node 709. Node 714 goes HIGH after every rising edge on node 709, i.e. after a delay which is longer than the shortest pulse-width on node 709, and goes again to LOW, after a delay (with respect to the rising edge on node 709) which is shorter than the longest pulse-width on node 709. Curve 725 shows the voltage on node 714. When the level at node 714 is HIGH, the output of 718 is reconfirmed by setting or resetting the toggle-flip-flop 717 through its inputs 721 and 716 respectively. Curve 726 illustrates when the Toggle-flip-flop is SET, curve 727 illustrates when it is RESET. If the Toggleflip-flop 717 is in a wrong state (e.g. at the start-up of the system, the voltage level at node 718 might not correspond-correctly to the voltage level at node 700), it is brought in the correct state as demonstrated by curve 728. Assume that e.g., at power-up input 700 is LOW, and output 718 is HIGH (incorrect). The SET pulse on node 721 brings the output 718 in correspondence with the input 700. In normal operation, the voltage on node 718 is as illustrate by curve 729, and closely follows the input signal on node 700 (illustrated by curve 723). To make the system robust enough to temperature and process variations, a large pulse-difference is advisable. The short pulse should be e.g. 500 picoseconds, and the long pulse 2 nanoseconds. One shot 711 can then be targeted to deliver a pulse width of 800 picoseconds, one shot 710 can then be targeted to deliver a pulse width of 1.5 nanosecond.

The preferable method of transmission via pulses makes use of a mixture of coupling half-conductively and capacitively. In the previous examples, mating pads were conductively connected to the half-conductive layer and via the half-conductive layer to each other. In the case of an integrated circuit, this requires that the last insulating layer be removed locally to make openings to allow for electrical contact to the conductive pads. This is generally done for conventional electrical bonding pads too. However, in the preferred embodiment, at the sending and at the receiving side the insulating capping layer (typically 1-micron thick) can be left intact. In this way, the mating conductive plates get capacitively connected to the half conductive layer through their respective capping layers. An additional advantage to this system is that it avoids problems such as metallurgical contamination or interface problems as no contact between conductive pad and half-conductive layer is required. Moreover, ESD-protection is provided, since the pads are not open to the air and hence cannot be inadvertently contacted or shorted.

The operation of the system is now explained in more detail with reference to FIGS. 14(A), 14(B) and 15. Two connected substrates are shown, chip A 606, and chip B 609. In the example, three channels link chip A 606 digitally to chip B 609. We now consider the middle of the three channels. It consists of a transmitting inverter 601, connected to a conducting pad 604. The capping layer 607 on top of pad 604 is left intact. Capping layer 607 is typically an insulating/passivation layer formed as one of the last processing steps in manufacturing an integrated circuit. Between the two substrates is the half-conductive layer 608. Capping layer 613 of chip B 609 is also left intact on top of conductive pad 615. Conductive pad 615 is connected to node 611. Node 611 serves as the input to receiving circuit 618. The output of receiving circuit 618 is node 640. Conductive pad 615 is schematically illustrated including parasitic capacitance 621 with the substrate of chip B 609 and with possible underlying metal wiring in chip B 609.

Figure 14A:
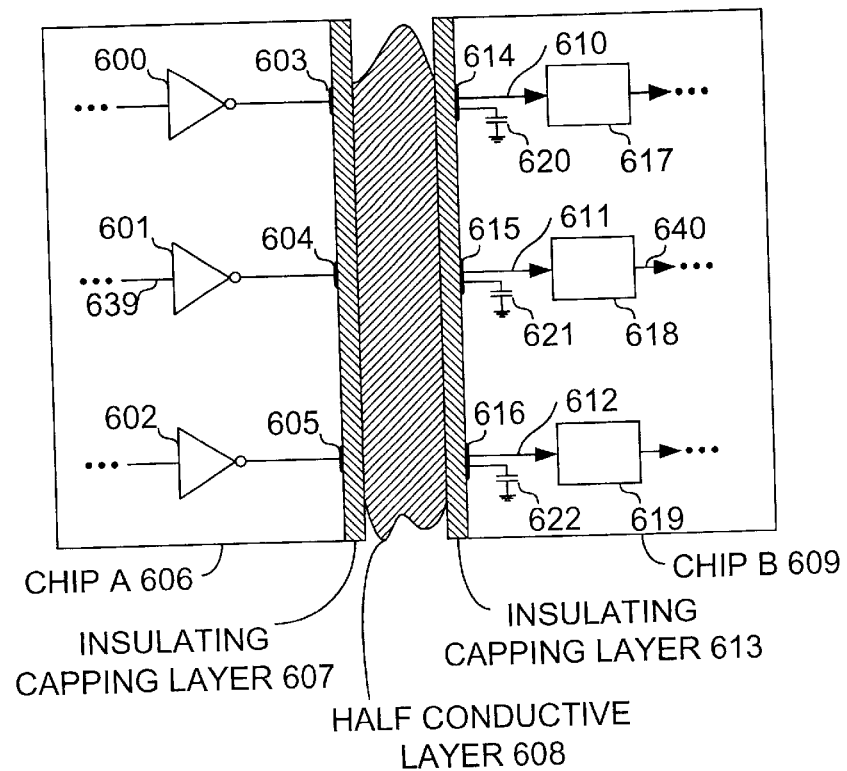
FIG. 14(A) illustrates schematically two integrated circuit chips interconnected through two capacitive layers and a half-conductive layer.
Figure 14B:
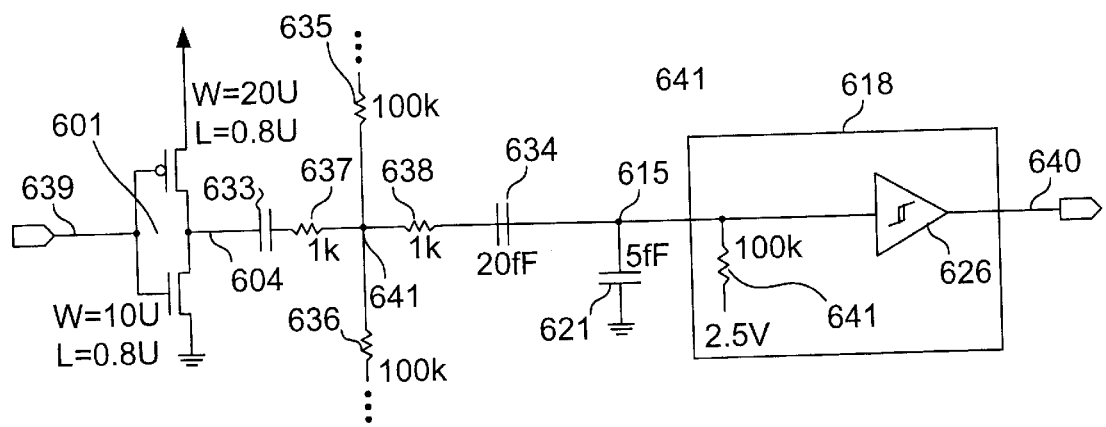
FIG. 14(B) illustrates schematically a model of the circuit illustrated in FIG. 14(A).

In FIG. 14(B), the equivalent circuit for FIG. 14(A) is illustrated providing details of receiving circuit 618. Capacitance 633 symbolizes the capacitance formed between two "plates", the conductive pad 604 and the half-conductive layer 608. The latter is not really a plate, but it may be modeled to behave relatively similar. Insulating capping layer 607 and metal-oxide possibly formed on top of pad 604 form the dielectric layer of the capacitance. Similarly, capacitance 634 represents pad 615, the half-conductive layer 608 and the insulating capping layer 613 (with possible metal-oxides formed on the surface of pad 615) as dielectric material. Resistor 641 and Schmitt-trigger 626 form receiver 618. Other receiver topologies can be used including a trans-impedance amplifier approach and other circuits as are well known in the art.

Capacitances 633 and 634 form feed-through capacitances, i.e. they pass the signal's high frequency components, in the case illustrated in FIG. 14(A) from left to right. Feed-through capacitances do not hinder nor delay the high frequency components in the signal. However, parasitic capacitance 621 causes some delay and signal attenuation. Parasitic capacitance 621 and wanted conductances 637 and 638 in the half conductive layer 608 form a low-pass filter. The wanted conductance can be increased if necessary to offset the filtering effect. With feed-through capacitances 633 and 634 (in series), the parasitic capacitance 621 forms a capacitive voltage divider. To minimize the effect of this capacitive voltage divider, capacitance 621 should preferably be at least four times smaller than capacitance 634. To this end, the receiving pad 615 is preferably formed in the highest level metal of the given process. Between pad 615 and its corresponding substrate 609, as little as possible metal should be used. For a four-metal process, pad 615 should be implemented in metal4 (i.e. the highest level metal), whereby metal1, metal2 and metal3 (metal layers not shown in the figures) should not be routed under pad 615. Assuming that the sum of the thicknesses of the insulating layers between metal4 and the substrate is about four times the thickness of capping layer 613 (and assuming the dielectric constants for the insulating layers on substrate 609 is roughly equivalent to the dielectric constant for insulating layer 613) parasitic capacitance 621 would be roughly four times smaller than capacitance 634. For newer technologies with more metal layers and hence more insulating layer thickness, parasitic capacitance 621 become relatively less important. As shown in FIGS. 14A) and 14(B), with a four times smaller capacitance 621 than capacitance 634, a rising or falling edge on node 604 will deliver a signal of at least three quarters of the power supply voltage (when the receiver 618 is not connected). When the receiver 618 is connected, the voltage swing at node 615 will be somewhat limited due to the input capacitance of the receiver, but not significantly enough to affect performance.

In system simulations, a sending pad 604 with an area of 50 micron×50 micron. This gives typically a capacitance 633 of 80 fF. The receiving pad 615 is assumed to be 25×25 micron. As discussed above, when the sending circuit has a low output impedance (for example inverter 601) it is beneficial to use a smaller receiver pad area. This is true also in this example when coupling using capacitive feedthrough such as through capping layers 607 and 613. Capping layer 613 provides an approximately 20 fF feedthrough capacitance 634. The associated parasitic capacitance 621 is estimated to be one-quarter, thus 5 fF. Resistor 641 of receiving circuit 618 is chosen at 100 k-ohms and is intended to keep the DC-level on node 615 between the two threshold levels of the Schmitt-trigger (e.g. 2V for the falling edge, and 3V for the rising assuming operation at Vcc=5V).

Figure 15:
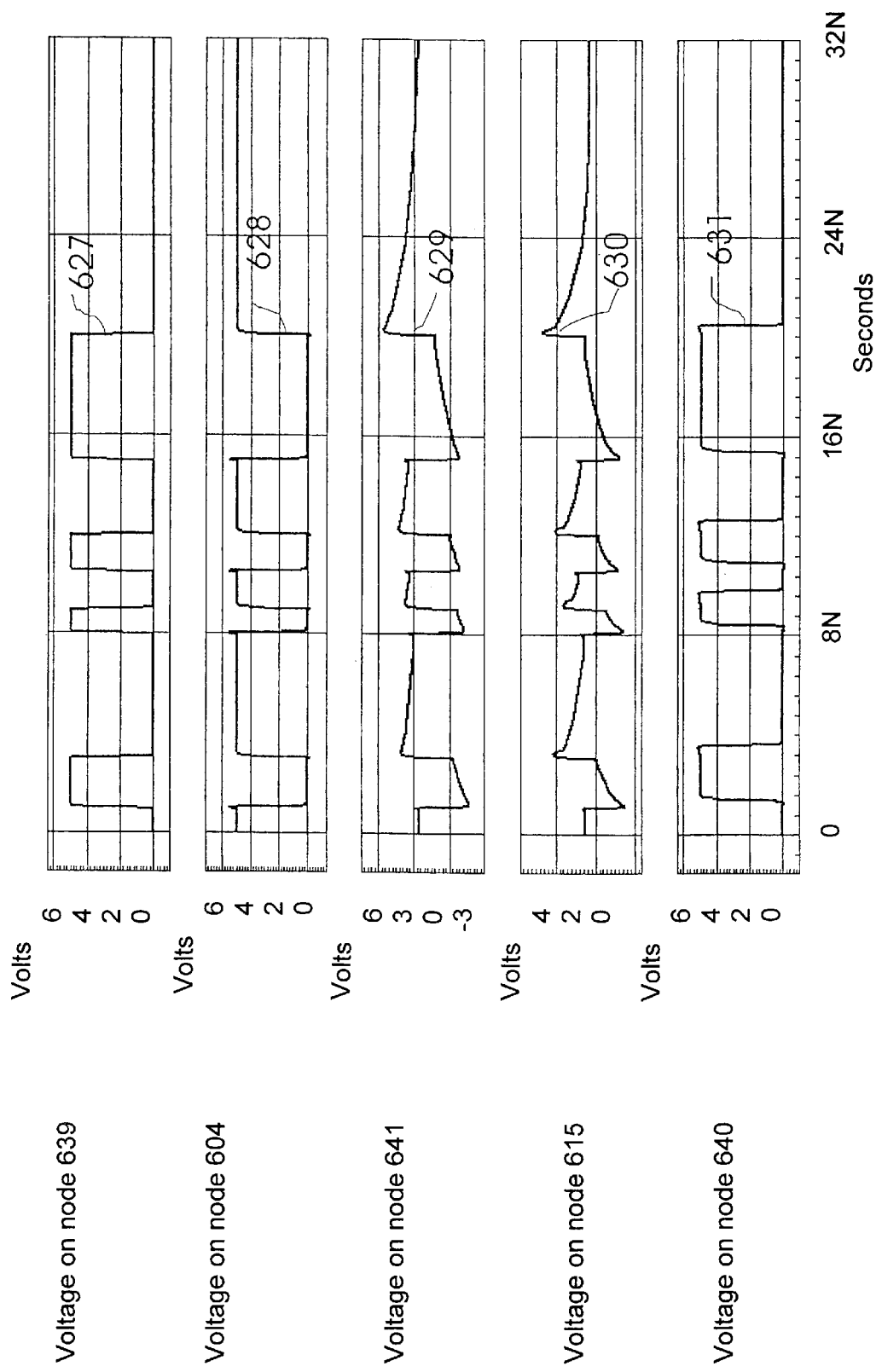
FIG. 15 illustrates the voltage levels at various nodes of the circuit of FIG. 14(B).

Curves resulting from a simulation using the values discussed above and indicated in FIG. 14(B) are shown in FIG. 15. Curve 627 corresponds to the voltage applied to the input node 639. At the sending pad (node 604) the voltage is given by curve 628. In the middle of the half-conductive layer, "node" 641, the voltage curve 629 follows the high frequency components of curve 628. Curve 630 represents the voltage at the input 615 of the receiver 618. Curve 631, representing the voltage on node 640 is generated by Schmitt-trigger 626. Curve 631 illustrates the voltage signal on node 640 and, as shown, provides relatively little signal degradation vis-à-vis curve 627, with a latency shorter than 0.5 ns.

Chip & MCM coupling (going off chip). As discussed above, it is generally advantageous to avoid the use of a substrate or board (such as MCM or PCB), and to preferentially "flip chips" immediately to each other, i.e. to directly couple chips without an intervening substrate such as a PCB as is known in the art. However, in some circumstances, a PCB or MCM interconnect is preferable. For example, in many applications, several chips are connected to a common communication bus. Additionally, the pads of one chip may oftentimes need to be connected with several other chips. Heat dissipation is also a concern when placing integrated circuits, and may require the chips be staggered or placed on PCBs.

Figure 5:
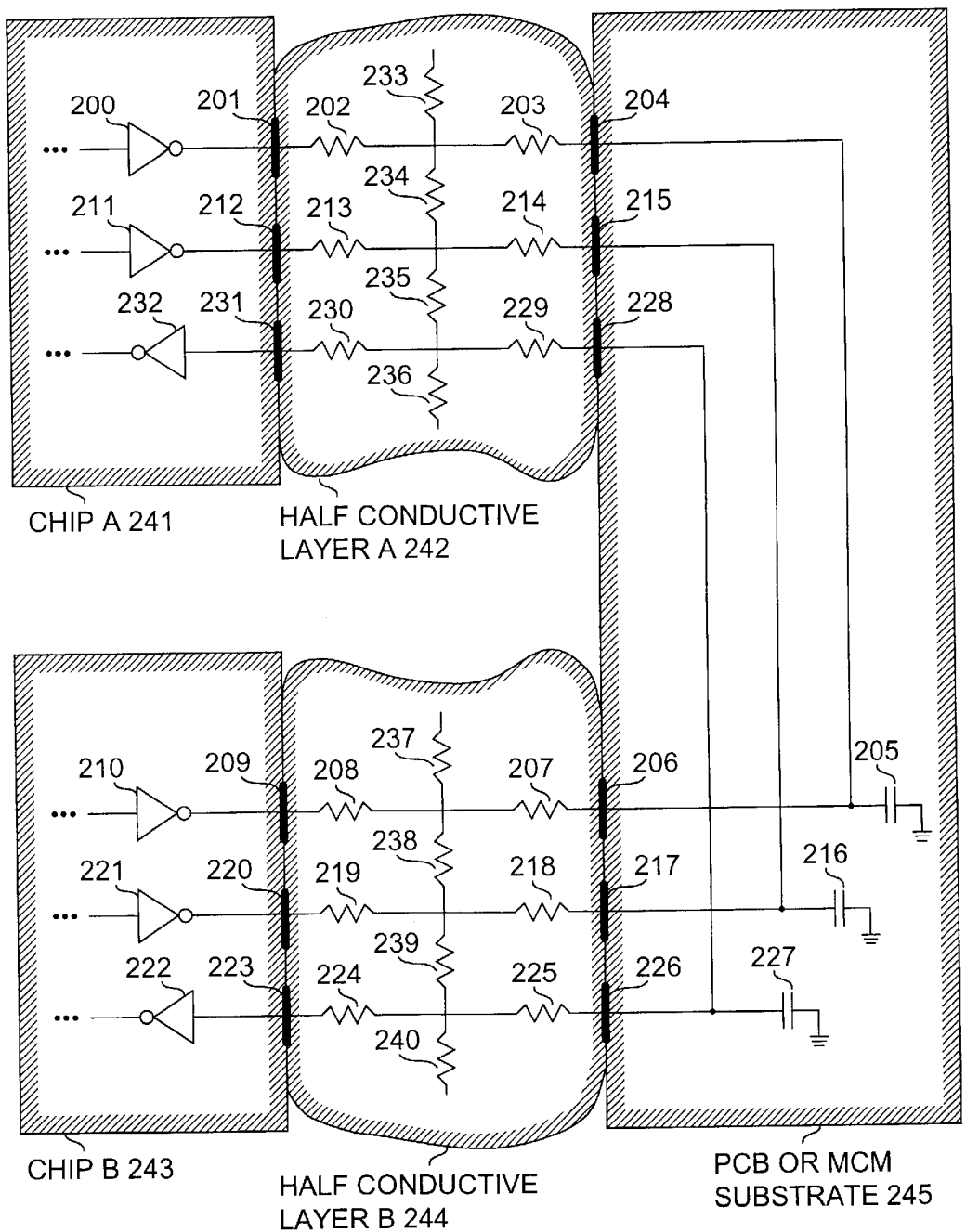
FIG. 5 illustrates schematically two integrated circuit chips disposed on a printed circuit board and interconnected therewith through two half-conductive layers.

Reference is made to FIG. 5 where Chip A 241 is coupled to PCB or MCM-substrate 245 via half-conductive layer A 242 and Chip B 243 is coupled to substrate 245 via half-conductive layer B 244. Chips A and B are connected to each other indirectly, via substrate 245.

Again three channels are shown, a first channel from chip A to chip B, where inverter/driver 200 drives the line, via half-conductive layer 242. The line represented by capacitance 205 has to be charged and discharged by inverter 200. The resulting signal is transmitted through half-conductive layer 244 to inverter/receiver 210. A second channel runs from 211, through half-conductive layer 242, through the line represented by capacitance 216, and ends at inverter/receiver 221. In the other direction, i.e. from chip B to chip A, a third channel is illustrated starting at inverter 222, and ending at inverter/receiver 232. In the half-conductive layers, unwanted conductances 233, 234 . . . 240 represent the cross-talk links and leakage paths discussed above. As shown, signals can go from any chip to any other chip on PCB 245 (or the same chip) via half-conductive layers 242 and 244 coupling the chips 241, 243 to the substrate 245 and the signal paths 205, 216, 227 on PCB 245.

The obstacle here, as with every wiring system, is to drive the parasitic capacitances of the wires. For channel one to three, the capacitances are numbered 205, 216 and 227 respectively. Assuming the wires are typical MCM traces with capacitances of 2 pF/cm, a 5-cm long wire results in a 10 pF capacitance to be charged and discharged. This is achieved normally by large driving transistors in the driver/inverter (inverter 200 for the first channel) of the channel. This line capacitance is about 100 times larger than the 100 fF for a conductive plate 201. Hence, the capacitance of the conductive plates 201, 204, 206, 209, etc. is treated as negligible.

Considering the second channel, line capacitance 216 has to be charged and discharged by inverter/buffer 211. Assuming a sufficiently strong inverter, the time to charge and discharge the capacitance 216 is determined by the RC time constant, where R is the sum of the resistances 213 and 214 and C is the line capacitance 216. R is the reciprocal of the wanted conductance. Assuming 86% change in voltage to be sufficient for changing the state of the line assumes again a delay of 2RC. If for going off-chip a delay of 5 nanosecond is acceptable, the maximum value for R is 250 Ohm. The wanted conductance thus needs to be at least 4 milliSiemens. The wanted conductance at the receiving side formed by 218 and 219, when having essentially the same value as the wanted conductance at the sending side, will drive with negligible delay (<100 ps) the inverter 221.

The difference in system performance between the chip to chip system illustrated in FIG. 4 and the chip to PCB to chip system illustrated in FIG. 5 is a factor of 20 (100 times more capacitance to drive in FIG. 5, but signal transmission is 5 times slower). This also implies, that for the same given isolation ratio, we will have a DC-power dissipation which is factor of 2×20=40 times higher. 20 for efficiency factor and 2 because there are two chips involved, meaning twice as many leakage paths (for the second channel, leakage paths are represented by resistors 234, 235 and 238, 239). Because of the additional power dissipation, it is preferable to use pulse signals, as discussed above with the system illustrated in FIG. 5.

Figure 6:
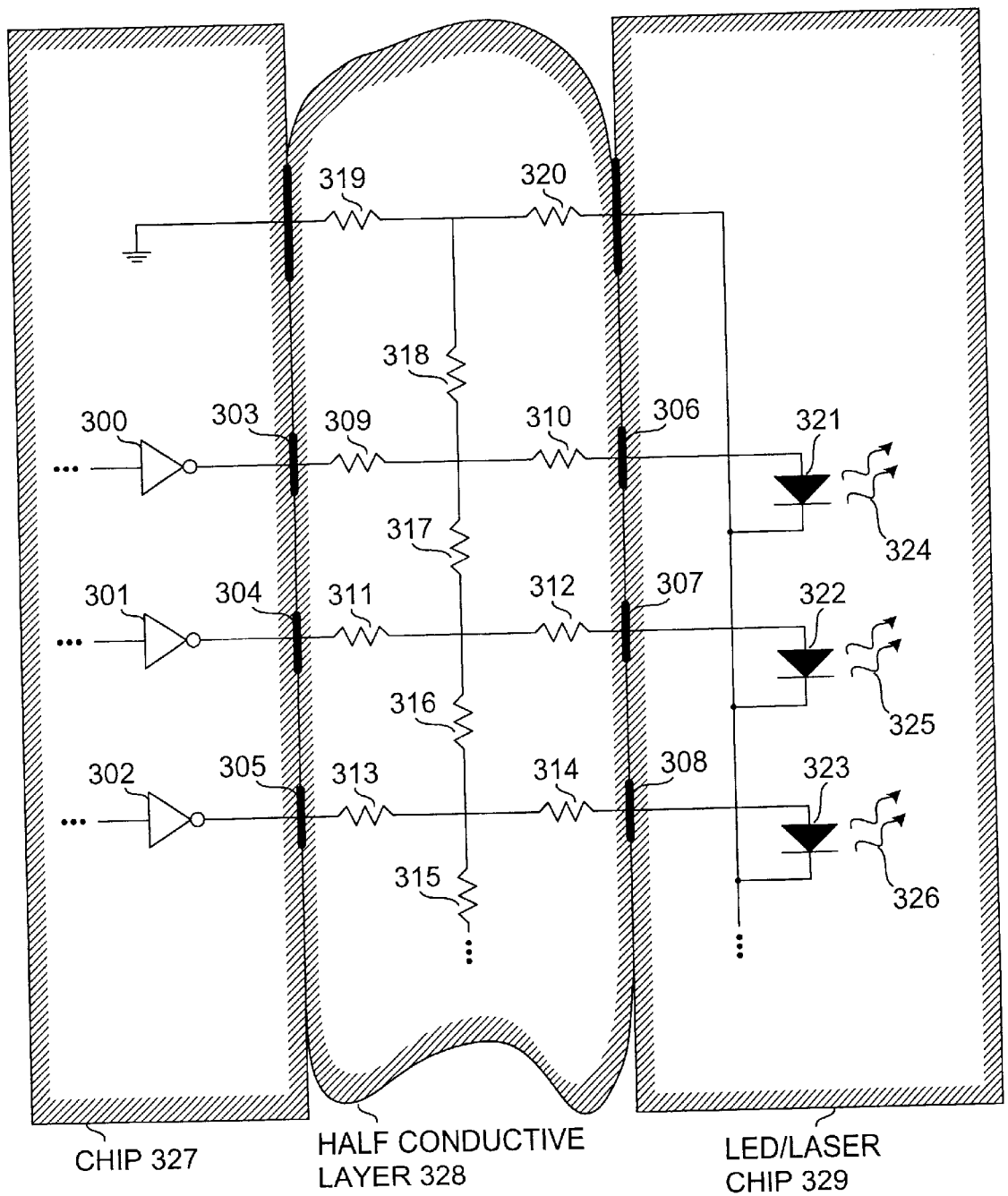
FIG. 6 illustrates schematically light sources coupled to a CMOS integrated circuit chip through a half-conductive layer.

Chip to LED/Laser coupling: Reference is now made to FIG. 6, which illustrates a system for connecting light source 329, such as LEDs or LASERs (including VCSELs) to Silicon VLSI IC's, such as chip 327, via a half-conductive layer 328. In this preferred embodiment, it is desired to drive light sources 321, 322, 323 with current from Chip 327. In this embodiment, power (in the form of current) is being transmitted across half-conductive layer 328 as well as information signals.

Light source 322 can be driven with a 1 mA current supplied from inverter 301 on chip 327. Assuming a maximum voltage drop of 1V is acceptable results in a wanted conductance, 311, 312, of at least 1 milliSiemens. The unwanted conductance 316, 317, being, as in previous examples, 200 times smaller than the wanted conductance (i.e. an isolation ratio of 200), will allow a current flow through the neighboring light source 321 (assuming a similar voltage drop) which is essentially 200 times smaller than the current through light source 322. Again the isolation ratio reflects the amount of cross-talk. A lower acceptable cross-talk between light channels requires a pad topology with better isolation ratio, such as larger pad geometries, or wider spacing between neighboring pads. Alternative methods for lowering cross-talk include the use of guarding with reference to FIG. 8, or the use of mating pads of different sizes. Smaller pad sizes for pads 306 . . . 308 than for pads 303 . . . 305, lowers the disturbance from neighboring pads (cross talk) considerably. Since this topography works well with low-impedance drivers in general, drivers 300 . . . 302 should not be driven into a high impedance state. For this last option to be effective, the output of the drivers 300 . . . 302 should not be steered into high-impedance state.

Figure 7:
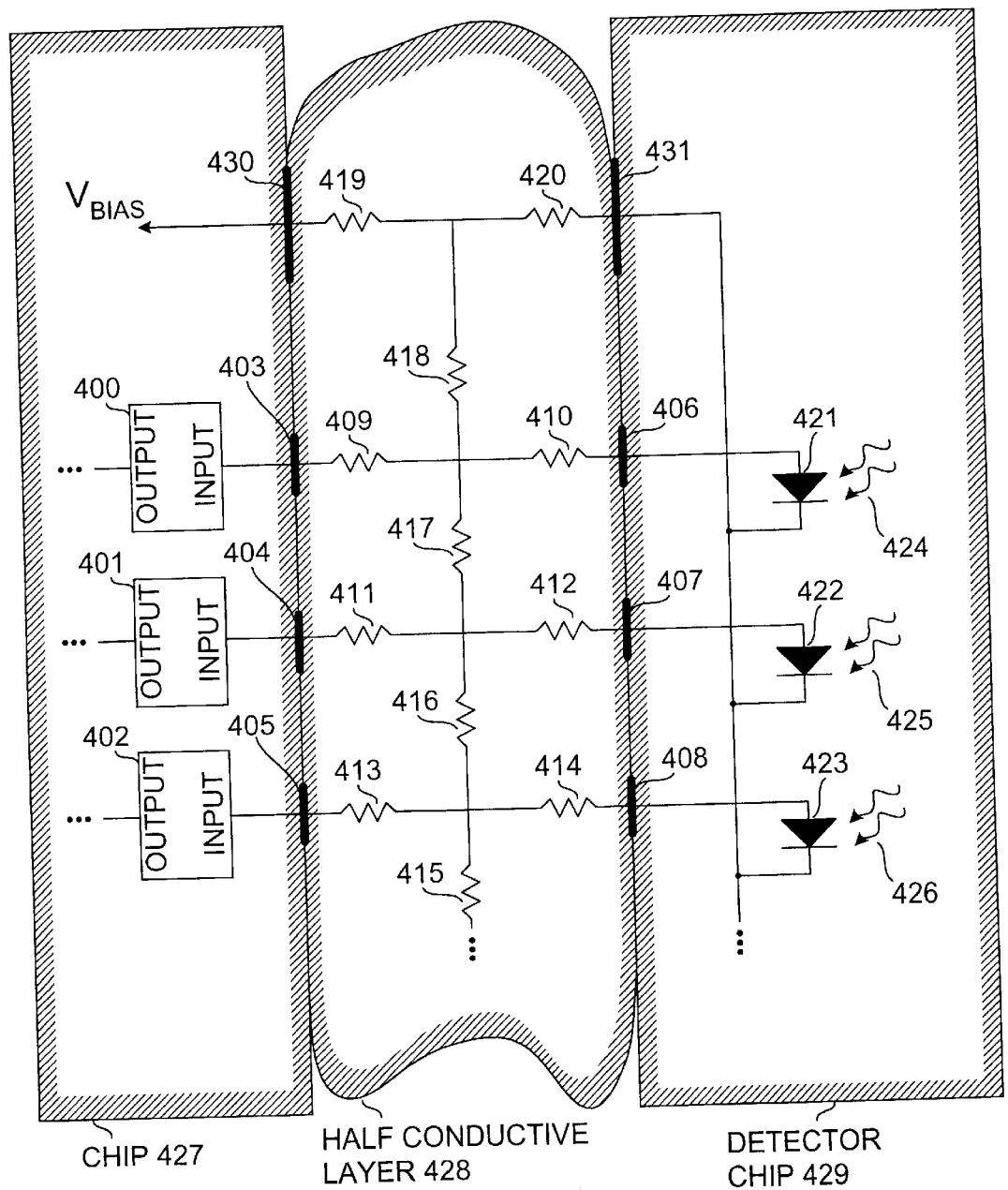
FIG. 7 illustrates schematically a detector chip coupled to an integrated circuit chip through a half-conductive layer.

Chip to Detector coupling: Reference is now made to FIG. 7, an alternate preferred embodiment wherein detector 429, which may include pin diodes, pn diodes, avalanche diodes, MCM diodes and other detection means is connected to chip 427, which is preferably a silicon VLSI IC via half-conductive layer 428. In this preferred embodiment, detectors 421, 422, 423 on chip 429 are read by electronic circuitry located on chip 427. Read-out circuitry blocks 400, 401, and 402 receive signals from detecting means 421, 422,and 423, respectively. Implementing an amplifier or converter in blocks 400, 401, and 402 with sufficiently low input impedance (with respect to the reciprocal of the wanted conductance) will ensure that most of the light-generated current from detectors 421, 422, and 423 is arriving in its corresponding block. Neighboring blocks will only sense a fraction of the light-generated current via unwanted conductances 415, 416, 417, and 418. Again, this is essentially depending on the achieved isolation ratio.

Figure 8:
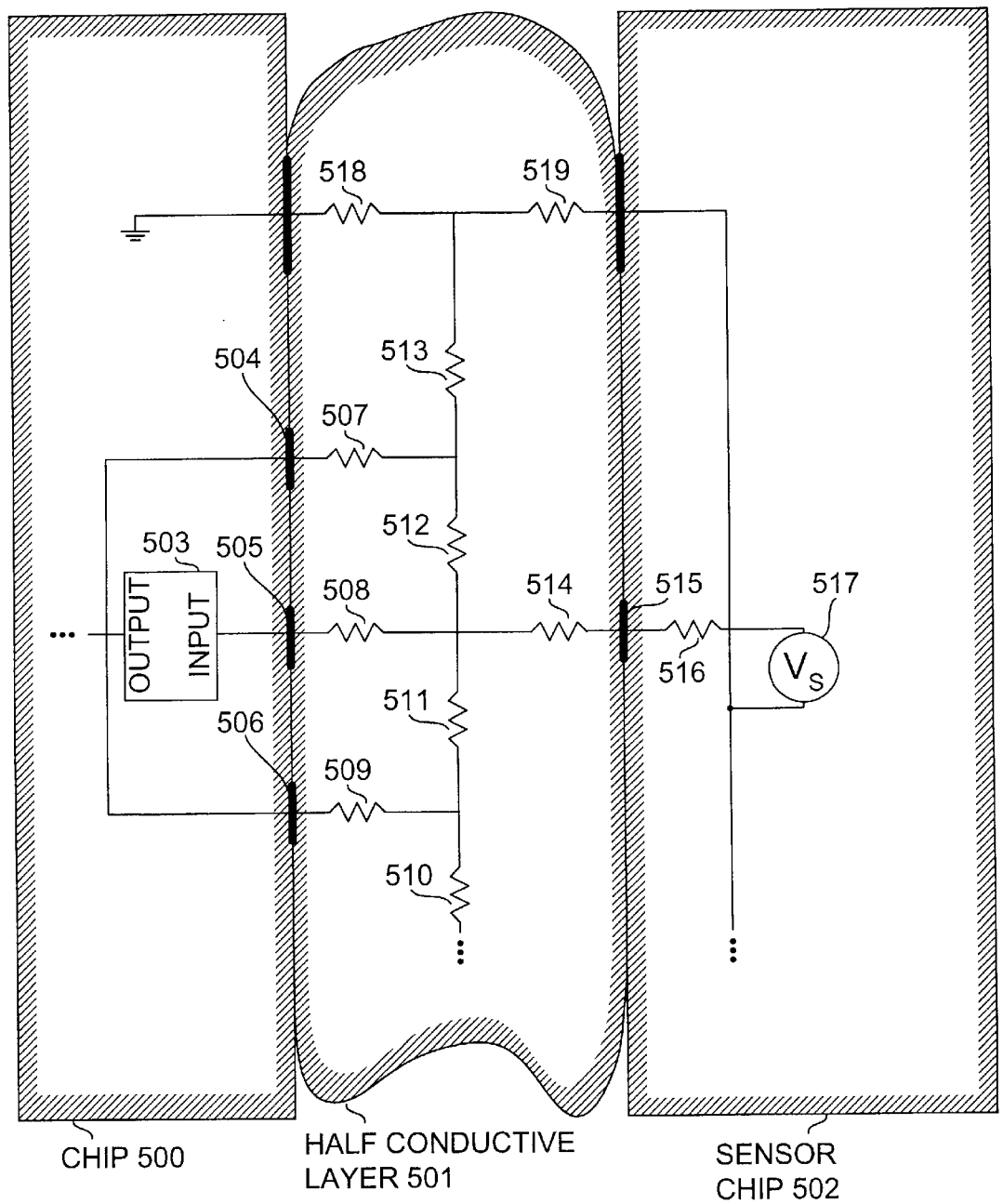
FIG. 8 illustrates schematically a sensor chip coupled to a read-out chip through a half-conductive layer.

Chip to Sensor coupling: The coupling of one or more sensors of any type to a Silicon VLSI chip 500 is illustrated in FIG. 8. Also illustrated in FIG. 8 is the principle of boot strapping and shielding. In this example, analog voltage source 517 and series resistance 515 represent a sensor on chip 502. Various sensors can be employed in the preferred embodiments including strain, pressure or temperature sensors, magnetic field sensors (Hall sensors), chemical sensors (pH sensors), and even an antenna or array of antennae. Alternatively the circuitry on chip 502 may represent any current or voltage signal source to be transmitted to chip 500. The resistance 516 connects to pad 515 and via the wanted conductance formed by 508 and 514, the resulting voltage at mating pad 505 is fed into block 503, which is preferably an amplifier with an amplification factor near one. The low impedance output of amplifier 503 drives neighboring pads 504 and 506 to essentially the same voltage as pad 505. As a result, the voltage across the unwanted conductances 512 and 511 is essentially zero, resulting in a minimal lateral, unwanted current. This effectively shields the channel between pad 515 and 505, lowering the cross-talk significantly. A simplified boot strapping mechanism can be obtained by using guard contacts connected to a fixed voltage. In FIG. 8, this can be achieved by connecting pads 504 and 506 to ground potential rather than to the output of the unity gain amplifier 503. The received voltage at pad 505 is now not an exact copy of the voltage delivered by the voltage source 517. It is essentially reduced by a fixed factor depending on the output resistance 516, the wanted conductances 508 and 514, and the unwanted conductances 512 and 511. However, neighboring channels, e.g. via unwanted conductances 510 or 513 will pose only very little influence on the received voltage when pads 504 and 506 are held to a ground or some other known bias.

Figure 9:
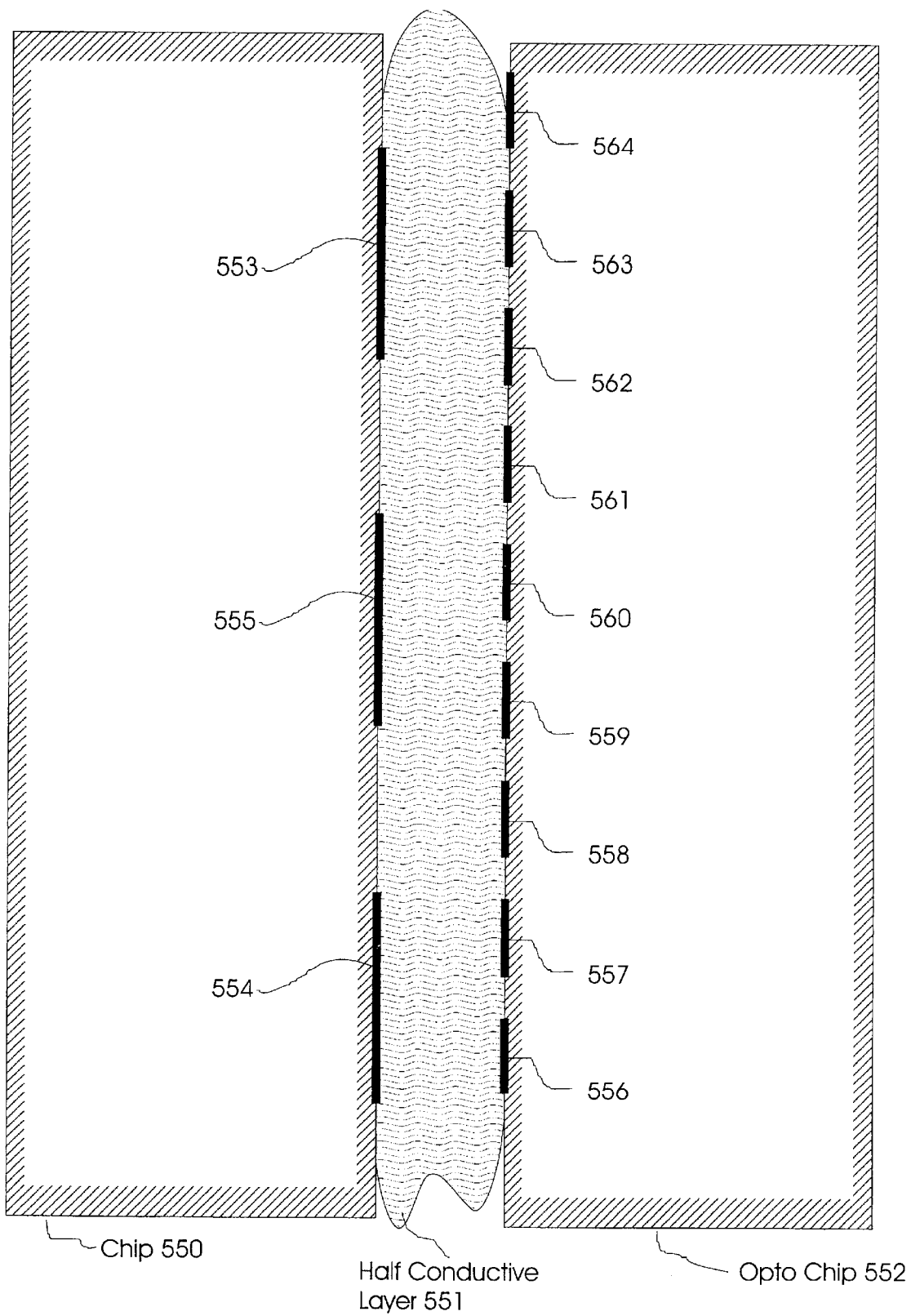
FIG. 9 is a cross section of two integrated circuit chips having unaligned mating pads connected through a half-conductive layer.

Unaligned coupling of Detectors, Light Emitters and Sensors: Reference is made to FIG. 9. Chip 552 has an array of pads 556, 557 . . . 564. Preferably, chip 552 contains an array of circuit components such as an array of Light Emitting Diodes (LEDs). Each pad 556, 557 . . . 564 is coupled to an LED circuit on chip 552 (not shown). Chip 552 is connected to chip 550 through half-conductive layer 551. Note that the number of pads on the LED-chip 552 is however greater than the number of pads of chip 550. Multiple pads at LED chip 552 oppose (at least to a certain extent) and thus mate with each pad of chip 550. Pad 555 of chip 550 mates with pads 560 and 559 of LED chip 552. When pad 555 injects current, the LED associated with pad 560 will shine brightest, the LED associated with pad 559 will shine, but a little less, and the LED associated with pad 561 (still close by) will shine, but only dimly. The center of brightness of the light emitted from LED chip 552 will be very close to the center of the pad 555. Shifts in the vertical placement of LED chip 552 would not affect the location of the center of brightness emitted by the LED array significantly. As illustrated by FIG. 9 LED chip 552 can be fabricated with a minimum number of contacts and connected to IC 550 with a great deal of tolerance built into the alignment requirements. In this way such an LED array can be considered essentially as an LED layer or LED substrate. This principle also works in the direction of connecting multiple detectors or sensors.

Figure 11A:
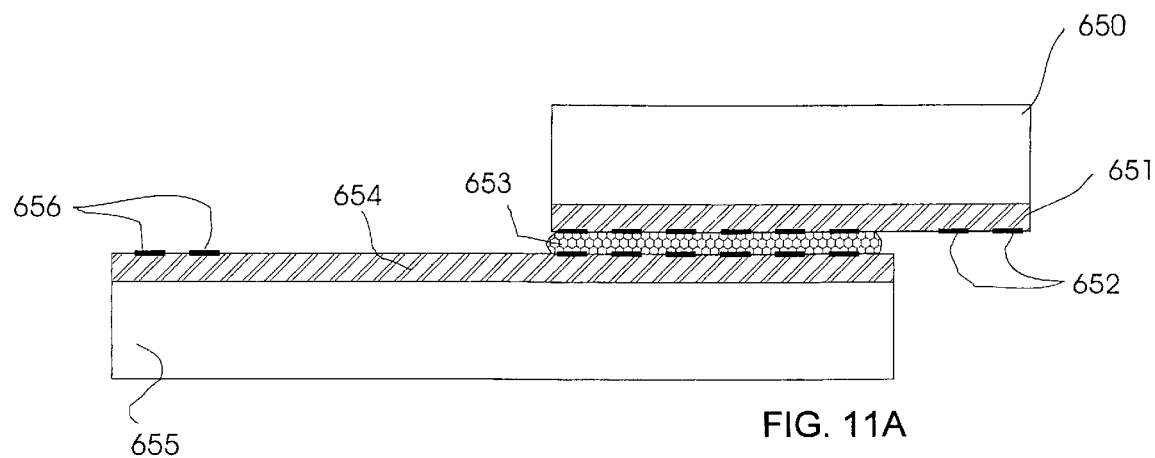
FIG. 11(A) is a cross section showing a substrate having interconnects employing both a half-conductive layer and conventional wire bonding.
Figure 11B:
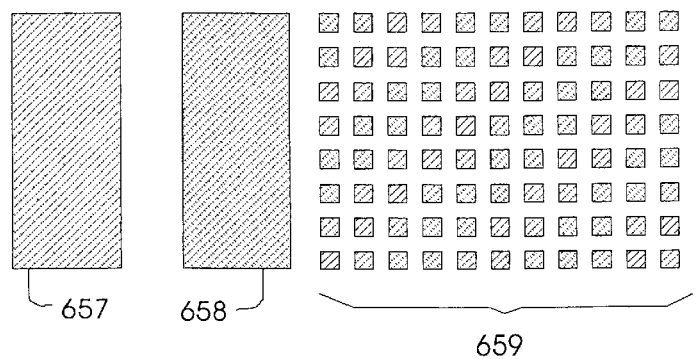
FIG. 11(B) is a top view of mating pads of different geometries for, e.g. signal and power transmission.

Coupling power supply via the half-conductive layer: Connected substrates require often one or more high conductive coupling paths, e.g. for the power supply. A way to achieve high conductive paths in combination with the present invention is illustrated by FIG. 11(A). The coupled substrates are configured such that a complete overlap is avoided. As shown, some pads on substrate 655 are coupled to substrate 650 via half-conductive layer 653. Other pads, however, e.g. pads 652 on substrate 650 and pads 656 on substrate 655 are available for conventional interconnection, such as through wire bonding or solder connections. Alternatively, extra high conductive coupling between substrates may be obtained by the use of extra large pads where high conductive coupling is required, as illustrated in FIG. 11(B). Note that pads 657 and 658 are much larger than the signal pads 659. The pad area can still be used to shelter circuitry, only the top metal layer is reserved for the extra large pad. The use of a few extra large pads 657, 658 in combination with aforementioned course area stencil printing (of the half-conductive material) provides for both power supply and information signal coupling between substrates in which one half-conductive layer couples the signal pads to mating pads on another substrate and a second half-conductive layer couples the power pads 657, 658 to mating power pads on the other substrate.

The foregoing described preferred embodiments are for illustration and explanation only and imply no limitations on the scope of the invention, which is defined by the below appended claims.

I claim:
1. A circuit comprising:
   a. a first electronic component having a first plurality of electrical contact pads;
   b. a second electronic component having a second plurality of electrical contact pads, at least one of said second plurality of electrical contact pads being substantially aligned with one of said first plurality of electrical contact pads; and
   c. a conductive layer interposed between said first and second electronic components and electrically coupling said first and second pluralities of electrical contact pads, said conductive layer electrically coupling each one of said first electrical contact pads to each other one of said first plurality of electrical contact pads, and electrically coupling each one of said second plurality of electrical contact pads to each other one of said second plurality of electrical contact pads and having isotropic resistivity.
2. The circuit of claim 1 further comprising:
   an insulating layer interposed between said first plurality of electrical contact pads and said conductive layer.
3. The circuit of claim 2 wherein signals traveling from said first electronic component to said second electronic component are capacitively coupled across said insulating layer and are conductively coupled across said conductive layer.
4. The circuit of claim 1 wherein said one of said first plurality of electrical contact pads is larger than said at least one of said second plurality of electrical contact pads.
5. The circuit of claim 1 wherein at least two of said second plurality of electrical contacts pads are substantially aligned with one of said first plurality of electrical contact pads.
6. The circuit of claim 1 wherein:
   a. said first electronic component further comprises a third plurality of electrical contact pads;
   b. said second electronic component further comprises a fourth plurality of electrical contact pads;
   c. a second half conductive layer interposed between said first and second electronic components and electrically coupling said third and fourth pluralities of electrical contact pads, said second conductive layer having isotropic resistivity; and
   d. wherein said conductive layer and said second conductive layer are electrically isolated from one another.
7. The circuit of claim 1 wherein:
   a. said first electronic component further comprises a first power contact pad;
   b. said second electronic component further comprises a mating power contact pad;

c. a second conductive layer interposed between said first and second electronic components and electrically coupling said first power contact pad and said mating power contact pad, said second conductive layer having isotropic resistivity; and d. wherein said conductive layer and said second conductive layer are electrically isolated from one another.

8. The circuit of claim 7 wherein:

a. said first conductive layer provides a coupling path for supplying logical signals to said first electronic component; and b. said second conductive layer provides a coupling path for supplying power to and from said first electronic component.

9. The circuit of claim 1 wherein said first electrical component is an integrated circuit and said second electrical component is a printed circuit board.

10. The circuit of claim 1 wherein said first and said second electrical components are integrated circuits.

11. The circuit of claim 1 wherein said conductive layer provides an isolation ratio of about 200.

12. The circuit of claim 1 wherein said conductive layer provides an isolation ratio of greater than 10.

13. The circuit of claim 1 wherein said conductive layer comprises multiple layers of conductive material.

14. The circuit of claim 1 wherein said conductive layer forms a conductive path between adjacent ones of said plurality of first electrical contact pads with a first conductance, and forms a conductive path between said at least one of said second plurality of electrical contact pads and said one of said first plurality of electrical contact pads with a second conductance, and wherein the ratio of said second conductance to said first conductance is at least ten.

15. A method for connecting electrical components comprising:

a. substantially aligning a first electrical contact pad on a first electronic component having a first plurality of electrical contact pads with a second electrical contact pad on a second electronic component having a second plurality of electrical contact pads;

b. placing said first electronic component adjacent said second electronic component; and c. disposing between said first and second electronic components a conductive layer, wherein said conductive layer electrically couples said first and second pluralities of electrical contact pads to each other and also electrically couples each of said first plurality of electrical contact pads to each other of said first plurality of electrical contact pads and electrically couples each of said second plurality of electrical contacts pads to each other of said second plurality of electrical contact pads.

16. The method of claim 15 wherein a gap is formed between said first and second electrical components when said first electronic component is placed adjacent said second electronic component, further comprising the step of sealing said gap between said first and second electronic components.

17. The method of claim 15 wherein said conductive layer forms an unwanted conductance path between adjacent ones of said first plurality of electrical contact pads and forms a wanted conductance path between said first electrical contact pad and said second electrical contact pad, and wherein said wanted conductance is at least ten times greater than said unwanted conductance.

18. An electrical system comprising:

a. a first electronic component comprising at least one conductive pad;

b. a second electronic component comprising at least one mating conductive pad;

c. an unpatterned half conductive layer disposed between said first and second electronic components and coupling said conductive pad and mating conductive pad;

d. said first electronic component further comprising at least two neighboring conductive pads adjacent said conductive pad; and an amplifier circuit with an input and an output, said input being coupled to said conductive pad, said output being coupled to said neighboring conductive pads, wherein said amplifier drives said neighboring conductive pads to a voltage level equivalent to a voltage level detected on said conductive pad.

* * * * *